United States Patent
Oh et al.

(10) Patent No.: US 9,508,847 B2
(45) Date of Patent: Nov. 29, 2016

(54) SEMICONDUCTOR DEVICE HAVING DUAL WORK FUNCTION GATE STRUCTURE, METHOD FOR FABRICATING THE SAME, TRANSISTOR CIRCUIT HAVING THE SAME, MEMORY CELL HAVING THE SAME, AND ELECTRONIC DEVICE HAVING THE SAME

(71) Applicant: SK hynix Inc., Gyeonggi-do (KR)

(72) Inventors: Tae-Kyung Oh, Gyeonggi-do (KR); Jin-Yul Lee, Gyeonggi-do (KR); Eun-Jeong Kim, Gyeonggi-do (KR); Dong-Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/739,811

(22) Filed: Jun. 15, 2015

(65) Prior Publication Data

US 2016/0172488 A1    Jun. 16, 2016

(30) Foreign Application Priority Data

Dec. 16, 2014  (KR) .................. 10-2014-0181554

(51) Int. Cl.
*H01L 29/78* (2006.01)
*H01L 29/423* (2006.01)
*H01L 29/51* (2006.01)

(52) U.S. Cl.
CPC ....... *H01L 29/7827* (2013.01); *H01L 29/4236* (2013.01); *H01L 29/513* (2013.01)

(58) Field of Classification Search
CPC .......... H01L 29/7827; H01L 29/4236; H01L 27/10876
See application file for complete search history.

(56) References Cited

U.S. PATENT DOCUMENTS

| 9,306,022 B1 * | 4/2016 | Oh ..................... H01L 29/4941 |
| 2013/0256770 A1 | 10/2013 | Huh et al. |
| 2014/0159145 A1 | 6/2014 | Park et al. |
| 2014/0197484 A1 | 7/2014 | Anathan et al. |

* cited by examiner

*Primary Examiner* — Seahvosh Nikmanesh
(74) *Attorney, Agent, or Firm* — I P & T Group LLP

(57) ABSTRACT

A semiconductor device including a substrate in which a trench is formed, a first impurity region and a second impurity region formed in the substrate separated from each other by the trench, a gate electrode formed to fill a lower part of the trench, and a capping layer formed over the gate electrode to fill an upper part of the trench. The gate electrode includes a first work function liner formed over a bottom surface and sidewalls of the lower part of the trench without overlapping with the first impurity region and the second impurity region, and including an aluminum-containing metal nitride; and a second work function liner formed over the sidewalls of the lower part of the trench over the first work function liner, overlapping with the first impurity region and the second impurity region, and including a silicon-containing non-metal material.

15 Claims, 28 Drawing Sheets

SEMICONDUCTOR DEVICE HAVING DUAL WORK FUNCTION GATE STRUCTURE, METHOD FOR FABRICATING THE SAME, TRANSISTOR CIRCUIT HAVING THE SAME, MEMORY CELL HAVING THE SAME, AND ELECTRONIC DEVICE HAVING THE SAME

CROSS-REFERENCE TO RELATED APPLICATION

This application claims priority under 35 U.S.C. §119 to Korean Patent Application No. 10-2014-0181554 filed on Dec. 16, 2014, the disclosure of which is herein incorporated by reference in its entirety.

BACKGROUND

1. Technical Field

Exemplary embodiments of the present invention relate to a semiconductor device, and more particularly, to a semiconductor device having a dual work function gate structure, a method for fabricating the same, a memory cell having the same, and an electronic device having the same.

2. Related Art

As a semiconductor device is highly integrated, a gate-induced drain leakage (GIDL) characteristic in a non-planar transistor exerts a substantial influence on the performance of the semiconductor device.

SUMMARY

Various embodiments are directed to a semiconductor device capable of improving gate-induced drain leakage (GIDL) current and current drivability, and a method for fabricating the same.

Also, various embodiments are directed to a memory cell capable of improving a refresh characteristic.

Further, various embodiments are directed to an electronic device with improved performance.

In an embodiment, a semiconductor device may include a substrate in which a trench is formed, a first impurity region and a second impurity region formed in the substrate separated from each other by the trench, a gate electrode formed to fill a lower part of the trench, and a capping layer formed over the gate electrode to fill an upper part of the trench, the gate electrode including: a first work function liner formed over a bottom surface and sidewalls of the lower part of the trench without overlapping with the first impurity region and the second impurity region, and including an aluminum-containing metal nitride; and a second work function liner formed over the sidewalls of the lower part of the trench over the first work function liner, overlapping with the first impurity region and the second impurity region, and including a silicon-containing non-metal material.

In an embodiment, a semiconductor device may include a substrate in which a trench is formed, a first impurity region and a second impurity region formed in the substrate separated from each other by the trench, a gate electrode formed to fill a lower part of the trench, and a capping layer formed over the gate electrode to fill an upper part of the trench, the gate electrode including: a first work function liner formed over a bottom surface and sidewalls of the lower part of the trench without overlapping with the first impurity region and the second impurity region, and including an aluminum-containing metal nitride; a second work function liner formed over the sidewalls of the lower part of the trench over the first work function liner, overlapping with the first impurity region and the second impurity region, and including a silicon-containing non-metal material; a first low resistivity electrode partially filling the lower part of the trench over the first work function liner; and a second low resistivity electrode formed over the first low resistivity electrode to fill the remaining lower part of the trench over the second work function liner, wherein each of the first low resistivity electrode and the second low resistivity electrode includes a material which is reactive with the second work function liner.

In an embodiment, a semiconductor device may include a substrate in which a trench is formed, a first impurity region and a second impurity region formed in the substrate to be separated from each other by the trench, a gate electrode formed to fill a lower part of the trench, and a capping layer formed over the gate electrode to fill an upper part of the trench, the gate electrode including: a first work function liner formed over a bottom surface and sidewalls of the lower part of the trench without overlapping with the first impurity region and the second impurity region, and including an aluminum-containing metal nitride; a second work function liner formed over the sidewalls of the lower part of the trench over the first work function liner, overlapping with the first impurity region and the second impurity region, and including a silicon-containing non-metal material; and a low resistivity electrode filling the lower part of the trench over the first work function liner and the second work function liner. The low resistivity electrode comprises: a lower portion formed over the first work function liner to partially fill the lower part of the trench; and an upper portion formed over the second work function liner to fill the remaining lower part of the trench, and having sloped sidewalls. The low resistivity electrode includes a non-reactive material to the second work function liner. The low resistivity electrode includes a fluorine-free material and is non-reactive with the second work function liner. The low resistivity electrode includes titanium nitride. The low resistivity electrode includes a reactive material to the second work function liner. The gate electrode further comprises: a barrier between the second work function liner and the low resistivity electrode, and between the first work function liner and the low resistivity electrode. The gate electrode further comprises: a first barrier between the first work function liner and the low resistivity electrode; and a second barrier between the second work function liner and the low resistivity electrode. The low resistivity electrode includes tungsten, and the first barrier and the second barrier include titanium nitride. The first work function liner includes titanium aluminum nitride, and the second work function liner includes an N-type impurity-doped polysilicon.

In an embodiment, a method for fabricating a semiconductor device may include: forming a trench in a substrate; forming a gate dielectric layer over a resultant structure including the trench; forming a gate electrode over the gate dielectric layer to fill a lower part of the trench; forming a capping layer over the gate electrode to fill an upper part of the trench; and forming a first impurity region and a second impurity region in the substrate on both sides of the gate electrode, wherein the forming of the gate electrode comprises: forming a first work function liner over a bottom surface and sidewalls of the lower part of the trench without overlapping with the first impurity region and the second impurity region, the first work function liner including an aluminum-containing metal nitride; and forming a second work function liner over the sidewalls of the lower part of the trench over the first work function liner, the second work function liner overlapping with the first impurity region and the second impurity region and including a silicon-containing non-metal material. The first work function liner is formed of titanium aluminum nitride. The second work function liner is formed of an N-type impurity-doped polysilicon. The forming of the gate electrode further comprises: forming a first work function liner layer over the gate dielectric layer; forming a first low resistivity layer over the first work function liner layer to fill the trench; recessing the first work function liner layer and the first low resistivity layer to form the first work function liner and a first low resistivity electrode, which partially fill the lower part of the trench; forming a second work function liner layer over a resultant structure including the first work function liner and the first low resistivity electrode; recessing the second work function liner layer to form a preliminary second work function liner which is formed over the sidewalls of the trench over the first work function liner and overlaps with the first impurity region and the second impurity region; forming a second low resistivity layer over a resultant structure including the preliminary second work function liner to fill the trench; and recessing the second low resistivity layer and the preliminary second work function liner to form a second low resistivity electrode and the second work function liner, which fill the remaining lower part of the trench. The second low resistivity electrode is formed of a non-reactive material to the second work function liner, and the first low resistivity electrode is formed of a fluorine-free material and is non-reactive with the second work function liner. The first low resistivity electrode and the second low resistivity electrode are formed of titanium nitride. The first low resistivity electrode and the second low resistivity electrode are formed of a reactive material to the second work function liner. The forming of the gate electrode further comprises: forming a lower barrier which is disposed between the first work function liner and the first low resistivity electrode; and forming an upper barrier which is disposed between the second work function liner and the second low resistivity electrode. The first and second low resistivity electrodes include tungsten, and the lower barrier and the upper barrier include titanium nitride. The forming of the gate electrode further comprises: forming a lower barrier which is disposed between the first work function liner and the first low resistivity electrode; forming an intermediate barrier which is disposed between the first low resistivity electrode and the second work function liner; and forming an upper barrier which is disposed between the second work function liner and the second low resistivity electrode. The first and second low resistivity electrodes include tungsten, and the lower barrier, the intermediate barrier and the upper barrier include titanium nitride. The forming of the gate electrode further comprises: forming a first work function liner layer over the gate dielectric layer; forming a low resistivity layer over the first work function liner layer to fill the trench; recessing for the low resistivity layer and the first work function liner layer to form a low resistivity electrode and the first work function liner, which fill the lower part of the trench; forming gaps which overlap with the first impurity region and the second impurity region, by removing an upper portion of the first work function liner; and forming the second work function liner which fills the gaps. The method for fabricating the semiconductor device, wherein, before the forming of the second work function liner, the forming of the gate electrode further comprises: recessing upper sidewalls of the low resistivity electrode to enlarge the gaps. The low resistivity electrode is formed of a fluorine-free material and is non-reactive with the second work function liner. The low resistivity electrode is formed of titanium nitride. The low resistivity electrode is formed of a reactive material to the second work function liner. The forming of the gate electrode further comprises: forming a barrier which is disposed between the first work function liner and the low resistivity electrode and between the low resistivity electrode and the second work function liner. The forming of the gate electrode further comprises: forming a lower barrier which is disposed between the first work function liner and the low resistivity electrode; and forming an upper barrier which is disposed between the low resistivity electrode and the second work function liner. The low resistivity electrode includes tungsten In an embodiment, a transistor circuit may include: a non-planar type transistor formed in a first region of a substrate, and including a source region and a drain region formed in the first region of the substrate separated from each other by a trench, a buried gate electrode formed to fill a lower part of the trench, and a capping layer formed over the buried gate electrode to fill an upper part of the trench; and a planar type transistor formed in a second region of the substrate, and including a planar gate electrode, wherein the buried gate electrode comprises: a first work function liner formed over a bottom surface and sidewalls of the lower part of the trench without overlapping with the source region and the drain region, and including titanium aluminum nitride; and a second work function liner formed over the sidewalls of the lower part of the trench over the first work function liner, overlapping with the source region and the drain region, and including an N-type doped polysilicon.

In an embodiment, a memory cell may include: a substrate in which a trench is formed; a first impurity region and a second impurity region formed in the substrate separated from each other by the trench; a buried word line formed to fill a lower part of the trench; a capping layer formed over the buried word line to fill an upper part of the trench; a bit line electrically coupled to the first impurity region; and a memory element electrically coupled to the second impurity region, wherein the buried word line comprises: a first work function liner formed over a bottom surface and sidewalls of the lower part of the trench without overlapping with the first impurity region and the second impurity region, and including titanium aluminum nitride; and a second work function liner formed over the sidewalls of the lower part of the trench over the first work function liner, overlapping with the first impurity region and the second impurity region, and including an N-type doped polysilicon.

In an embodiment, an electronic device may include at least one non-planar type semiconductor device including a substrate in which a trench is formed, a first impurity region and a second impurity region formed in the substrate separated from each other by the trench, a buried gate electrode formed to fill a lower part of the trench, and a capping layer formed over the buried gate electrode to fill an upper part of the trench, wherein the buried gate electrode comprises: a first work function liner formed over a bottom surface and sidewalls of the lower part of the trench without overlapping with the first impurity region and the second impurity region, and including titanium aluminum nitride; and a second work function liner formed over the sidewalls of the lower part of the trench over the first work function liner, overlapping with the first impurity region and the second impurity region, and including an N-type doped polysilicon.

DETAILED DESCRIPTION

Figure 1:
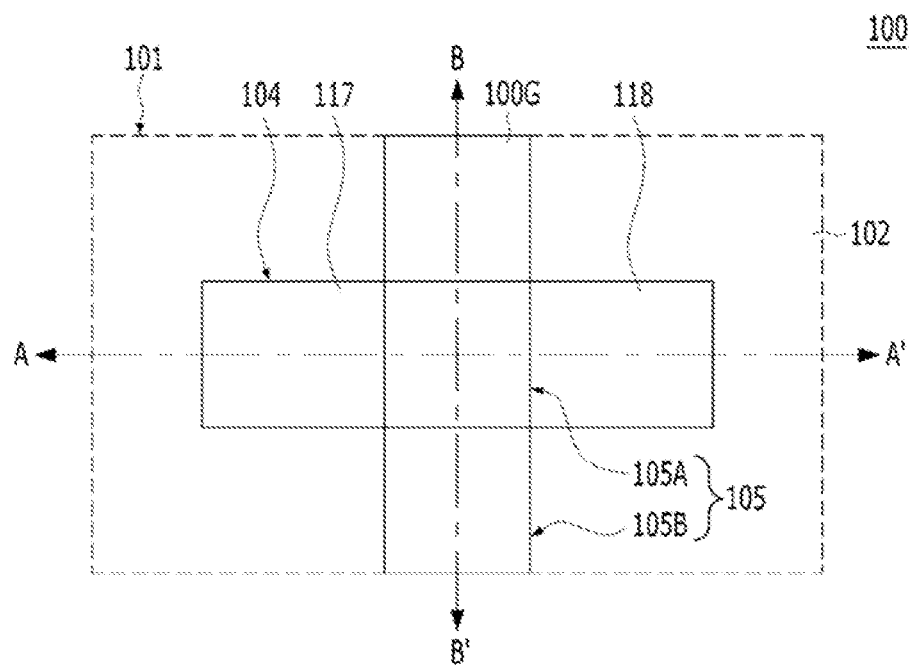
FIG. 1 is a plan view illustrating a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
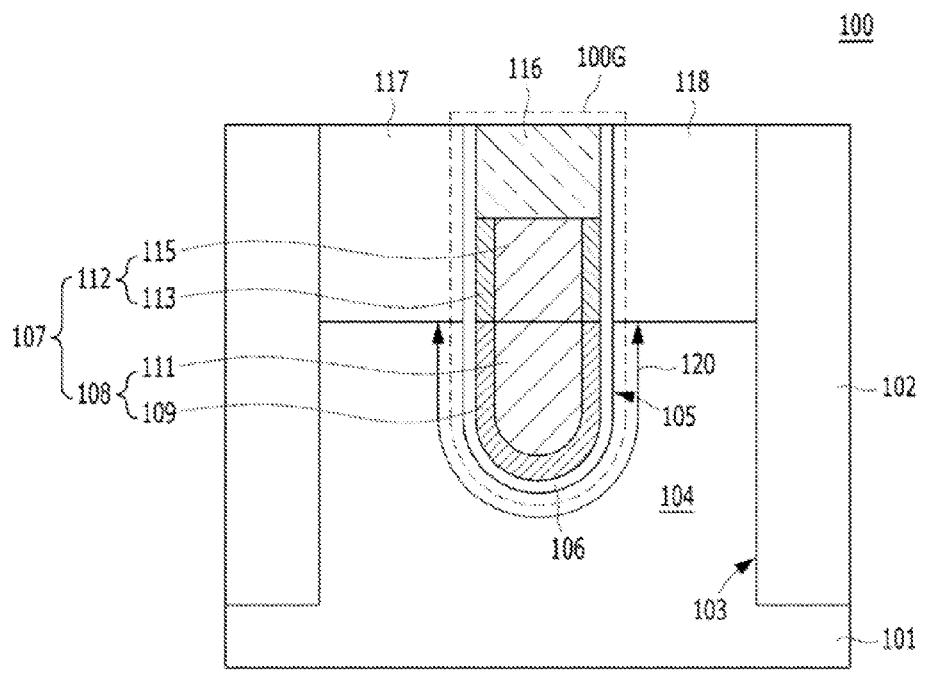
FIG. 2A is a cross-sectional view taken along the line A-A' of FIG. 1.
Figure 2B:
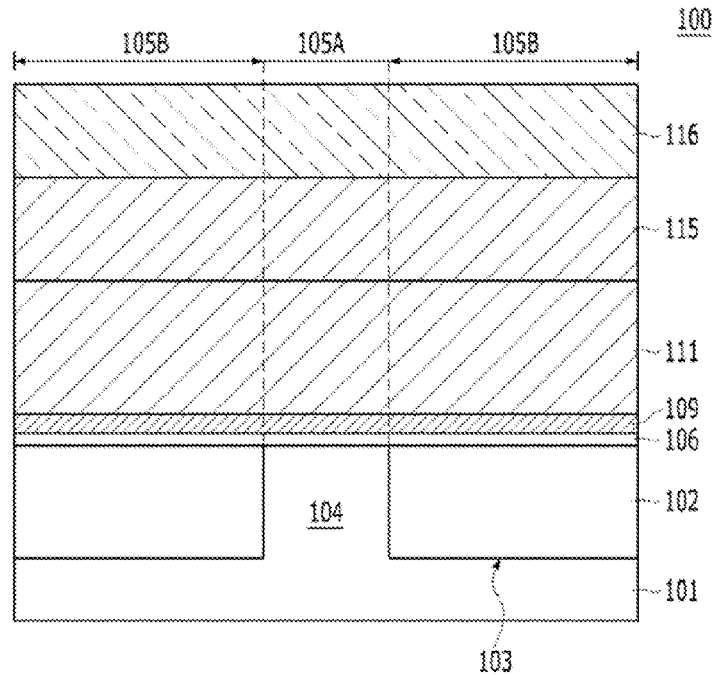
FIG. 2B is a cross-sectional view taken along the line B-B' of FIG. 1.

FIG. 1 is a plan view illustrating a semiconductor device in accordance with a first embodiment. FIG. 2A is a cross-sectional view taken along the line A-A' of FIG. 1. FIG. 2B is a cross-sectional view taken along the line B-B' of FIG. 1.

Referring to FIGS. 1, 2A and 2B, a semiconductor device 100 may include a gate structure 100G, a first impurity region 117, and a second impurity region 118. An isolation layer 102 and an active region 104 may be formed in a substrate 101. The first impurity region 117 and the second impurity region 118 may be disposed in the active region 104. A trench cross the active region 104 and the Isolation layer 102, that is, a gate trench 105, may be formed. The gate structure 100G may be formed in the gate trench 105. The first impurity region 117 and the second impurity region 118 may be separated from each other by the gate trench 105.

The semiconductor device 100 may include a transistor. The first embodiment and modifications thereof may be applied to a non-planar transistor, for example, a buried gate type transistor.

The semiconductor device 100 in accordance with the first embodiment will be described below in detail.

The semiconductor device 100 is formed in the substrate 101. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include another semiconductor material such as germanium. Also, the substrate 101 may include a III-V group semiconductor, for example, a compound semiconductor substrate such as GaAs. Further, the substrate 101 may include a silicon-on-insulator (SOI) substrate.

The isolation layer 102 and the active region 104 may be formed in the substrate 101. The active region 104 may be defined by the isolation layer 102. The isolation layer 102 may be a shallow trench isolation (STI) region which is formed by trench etching. The isolation layer 102 may be formed by filling a dielectric material in a shallow trench, for example, an isolation trench 103.

The gate trench 105 may be formed in the substrate 101. When viewed on the plan view, the gate trench 105 may have a line shape which extends in any one direction. The gate trench 105 may extend across the active region 104 and the isolation layer 102. The gate trench 105 may have a depth shallower than the isolation trench 103. The gate trench 105 may include a first trench 105A and a second trench 105B. The first trench 105A may be formed in the active region 104. The second trench 105B may be formed in the isolation layer 102. The second trench 105B may continuously extend from the first trench 105A. The bottom surfaces of the first trench 105A and the second trench 105B may be positioned at the same level at a given depth from the top surface of the active region 104. The bottom surface of the gate trench 105 may have a curvature.

The first impurity region 117 and the second impurity region 118 may be formed in the active region 104. The first impurity region 117 and the second impurity region 118 are regions which are doped with a conductivity type impurity. For example, the conductivity type impurity may include phosphorus (P), arsenic (As), antimony (Sb) or born (B). The first impurity region 117 and the second impurity region 118 may be doped with the same conductivity type impurity. The first impurity region 117 and the second impurity region 118 may be disposed in the active region 104 on both sides of the gate trench 105. The first impurity region 117 and the second impurity region 118 may respectively correspond to a source region and a drain region. The bottom surfaces of the first impurity region 117 and the second impurity region 118 may be positioned at the same level at a predetermined depth from the top surface of the active region 104. The first impurity region 117 and the second impurity region 118 may contact the sidewalls of the gate trench 105. The bottom surfaces of the first impurity region 117 and the second impurity region 118 may be located at a level higher than the bottom surface of the gate trench 105.

The gate structure 100G may be disposed in the gate trench 105. The gate structure 100G may be disposed in the active region 104 between the first impurity region 117 and the second impurity region 118 and extend to the isolation layer 102. The bottom surface of a portion of the gate structure 100G, which is disposed in the active region 104, and the bottom surface of a portion of the gate structure 100G, which is disposed in the isolation layer 102, may be positioned at the same level.

The gate structure 100G may include a gate dielectric layer 106, a gate electrode 107, and a capping layer 116. The top surface of the gate electrode 107 may be positioned at a level lower than the top surface of the active region 104. The gate electrode 107 may fill a lower part of the gate trench 105. Accordingly, the gate electrode 107 may be referred to as a buried gate electrode. The capping layer 116 may be disposed on the gate electrode 107 to fill an upper part of the gate trench 105. The gate dielectric layer 106 may be formed on the bottom surface and the sidewalls of the gate trench 105.

The gate dielectric layer 106 may include silicon oxide, silicon nitride, silicon oxynitride, a high-k material or a combination thereof. The high-k material may include a material which has a dielectric constant greater than the dielectric constant of silicon oxide. For example, the high-k material may include a material which has a dielectric constant greater than 3.9. For another example, the high-k material may include a material which has a dielectric constant greater than 10. For still another example, the high-k material may include a material which has a dielectric constant ranging from approximately 10 to approximately 30. The high-k material may include at least one metallic element. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

The gate electrode 107 may include a low resistivity portion and a work function portion. The work function portion may include a first work function liner 109 and a second work function liner 113. The low resistivity portion may include a first low resistivity electrode 111 and a second low resistivity electrode 115. A channel 120 may be formed along the gate electrode 107 between the first impurity region 117 and the second impurity region 118. The channel 120 has a channel length longer than a general planar type transistor. Accordingly, it is possible to prevent a short channel effect.

Hereinbelow, the first work function liner 109 and the first low resistivity electrode 111 will be collectively referred to as a lower buried portion 108. The second work function liner 113 and the second low resistivity electrode 115 will be collectively referred to as an upper buried portion 112.

The lower buried portion 108 may include the first work function liner 109 and the first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level. The first work function liner 109 may be formed on the bottom surface and the sidewalls of the gate trench 105 without overlapping with the first and second impurity regions 117 and 118. The lower buried portion 108 may overlap with the channel 120. Accordingly, the first work function liner 109 may overlap with the channel 120.

The upper buried portion 112 may include the second work function liner 113 and the second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The top surfaces of the second work function liner 113 and the second low resistivity electrode 115 may be positioned at the same level. The second work function liner 113 may be formed on the sidewalls of the gate trench 105 and overlap with the first and second impurity regions 117 and 118.

The capping layer 116 may fill the upper part of the gate trench 105 on the upper buried portion 112. The capping layer 116 may serve to protect the gate electrode 107. The capping layer 116 may include a dielectric material. The capping layer 116 may include silicon nitride, silicon oxynitride or a combination thereof. In another embodiment, the capping layer 116 may include a combination of silicon nitride and silicon oxide. For example, to form the capping layer 116, after performing lining by using silicon nitride, a spin-on-dielectric (SOD) may be filled.

The gate electrode 107 will be described below in detail.

The first work function liner 109 and the second work function liner 113 may be conductive materials. The first work function liner 109 and the second work function liner 113 are formed of different work function materials. The first work function liner 109 may have a work function greater than the second work function liner 113. The first work function liner 109 may include a high work function material. The second work function liner 113 may include a low work function material. The high work function material is a material which has a work function greater than the mid-gap work function of silicon. The low work function material is a material which has a work function lower than the mid-gap work function of silicon. That is, the high work function material may have a work function greater than 4.5 eV, and the low work function material may have a work function lower than 4.5 eV. The first work function liner 109 may include a metal-containing material. The second work function liner 113 may include a non-metal material.

The first work function liner 109 may include a metal nitride, and the second work function liner 113 may include a silicon-containing material. The first work function liner 109 may contain a first work function adjustment species to have a high work function. The first work function adjustment species may include aluminum (Al). Accordingly, the first work function liner 109 may include a metal nitride which contains aluminum. The work function of a metal nitride which contains aluminum is greater than the work function of a metal nitride which does not contain aluminum. In the present embodiment, the first work function liner 109 may include aluminum-containing titanium nitride. The aluminum-containing titanium nitride may be referred to as titanium aluminum nitride (TiAlN) or aluminum-doped titanium nitride (Al-doped TiN). The first work function liner 109 may protect the gate dielectric layer 106 from the first low resistivity electrode 111. For example, the first work function liner 109 may prevent the impurity contained in the first low resistivity electrode 111, from diffusing to the gate dielectric layer 106.

The second work function liner 113 has a low work function. The second work function liner 113 may contain a second work function adjustment species to have a low work function. The second work function adjustment species may include an N-type dopant. Accordingly, the second work function liner 113 may include a silicon-containing material which contains an N-type dopant. In the present embodiment, the second work function liner 113 may include polysilicon, and, for example, may include polysilicon doped with an N-type dopant hereinafter, referred to as an N-type doped polysilicon. The N-type doped polysilicon has a low work function. The N-type dopant may include phosphorus (P) or arsenic (As). The second work function liner 113 may overlap with the first impurity region 117 and the second impurity region 118. For example, the second work function liner 113 may horizontally overlap with the first impurity region 117 and the second impurity region 118.

The first low resistivity electrode 111 includes a material which has a specific resistivity lower than the first work function liner 109. The second low resistivity electrode 115 includes a material which has a specific resistivity lower than the second work function liner 113. The first low resistivity electrode 111 and the second low resistivity electrode 115 may be formed of the same material or different materials. The first low resistivity electrode 111 and the second low resistivity electrode 115 may be formed of a low resistivity material. Accordingly, the resistivity of the gate electrode 107 is decreased by the first low resistivity electrode 111 and the second low resistivity electrode 115. The first low resistivity electrode 111 and the second low resistivity electrode 115 include a low resistivity metal-containing material. To decrease the resistivity of the gate electrode 107, the second work function liner 113 may be formed to a thin thickness. Therefore, the resistivity of the gate electrode 107 may be significantly decreased by increasing the volume of a metal material.

In the first embodiment, the second low resistivity electrode 115 may be formed of a non-reactive material to the second work function liner 113. That is, the second low resistivity electrode 115 may be formed of a material which does not react with the second work function liner 113. For example, in the case where titanium nitride is used as the second low resistivity electrode 115, silicon of the second work function liner 113 and the second low resistivity electrode 115 do not react with each other. Therefore, a barrier may be omitted between the second low resistivity electrode 115 and the second work function liner 113.

In this way, the second low resistivity electrode 115 may be formed of a low resistivity metal-containing material which has a specific resistivity lower than the second work function liner 113 and is non-reactive with the second work function liner 113.

The first low resistivity electrode 111 may be formed of a low resistivity metal-containing material which has a specific resistivity lower than the first and second work function liners 109 and 113 and is non-reactive with the second work function liner 113. Moreover, the first low resistivity electrode 111 may be formed of a material which does not attack the gate dielectric layer 106. For example, the first low resistivity electrode 111 may be formed of a material which does not contain an impurity such as fluorine. The first low resistivity electrode 111 may be formed of a fluorine-free material The first low resistivity electrode 111 and the second low resistivity electrode 115 may include titanium nitride. Since the second low resistivity electrode 115 is a non-reactive material to the second work function liner 113 and the first low resistivity electrode 111 is a material which does not contain fluorine, the gate electrode 107 may not need a barrier, and thus, be referred to as a barrier-less gate electrode. In another embodiment, the first low resistivity electrode 111 and the second low resistivity electrode 115 may include tungsten which does not contain fluorine, that is, fluorine-free tungsten (FFW).

The first impurity region 117, the second impurity region 118 and the gate structure 100G may construct a transistor. For example, the transistor may be referred to as a buried gate type transistor. The channel 120 may be defined along the surface of the gate trench 105 between the first impurity region 117 and the second impurity region 118. In an embodiment, the channel 120 may include a dopant by channel doping.

According to the first embodiment, a threshold voltage (Vt) is controlled by the first work function liner 109. The threshold voltage may be shifted by the first work function liner 109. For example, the aluminum of the first work function liner 109 forms a dipole layer at an interface between the first work function liner 109 and the gate dielectric layer 106. The dipole layer may change the work function of the lower buried portion 108, and accordingly, may shift the threshold voltage. As a result, the dose of the channel 120 may be decreased by the first work function liner 109.

Since the gate trench 105 has a high aspect ratio, it is difficult to sufficiently perform doping to the bottom portion of the gate trench 105 by channel doping generally known in the art. Therefore, additional channel doping is locally performed on the bottom portion of the gate trench 105 after an initial channel doping, and this is referred to as local channel doping. In the case where implantation is applied by the local channel doping, it is referred to as a local channel implantation (LCI).

Since a channel dose may be decreased by the first work function liner 109, the dose of the local channel doping may be remarkably decreased or the local channel doping may be omitted. As a result, in the embodiments, since a channel dose is decreased, a junction leakage characteristic may be improved.

Further, in the first embodiment, since the second work function liner 113 has a low work function, gate-induced drain leakage (GIDL) at the first impurity region 117 and the second impurity region 118 may be suppressed. In the case where the first work function liner 109 of a high work function overlaps with the first impurity region 117 and the second impurity region 118, the gate-induced drain leakage may increase. Therefore, the first work function liner 109 may be adjusted in height to not overlap with the first impurity region 117 and the second impurity region 118. For example a low work function metal material, that is, an N-type work function metal may be used as the second work function liner 113. Since the N-type work function metal has a work function greater than the N-type doped polysilicon, it is difficult to obtain a low work function corresponding to the N-type doped polysilicon, by using the N-type work function metal.

While the specific resistivity of the second work function liner 113 may be relatively higher than other metal materials, an influence exerted on the resistivity of the gate electrode 107 may be minimized by decreasing the rate, that is, the thickness, of the second work function liner 113 in the gate electrode 107. In addition, since the second work function liner 113 does not exist on the top surface of the first low resistivity electrode 111, the rate of the second work function liner 113 in the gate electrode 107 may be further decreased.

The gate electrode 107 may be a dual work function buried gate electrode. For example, the dual work function buried gate electrode includes the first work function liner 109 which has a high work function and the second work function liner 113 which has a low work function.

The gate electrode 107 in accordance with the first embodiment may be applied to a buried gate type fin channel transistor.

Figure 3A:
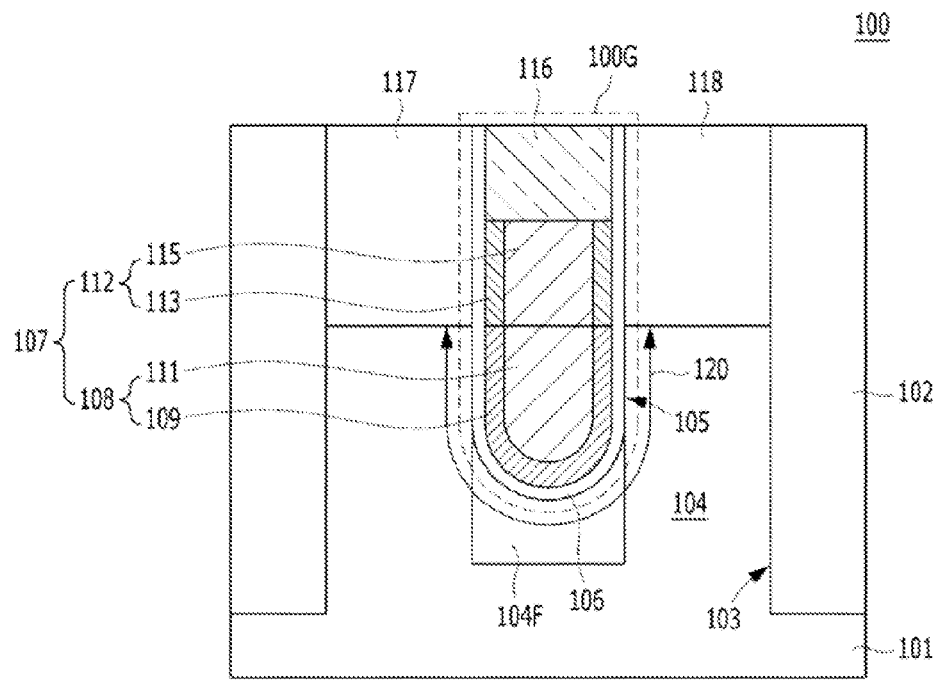
FIGS. 3A and 3B are cross-sectional views illustrating a buried gate type fin channel transistor to which the first embodiment is applied.
Figure 3B:
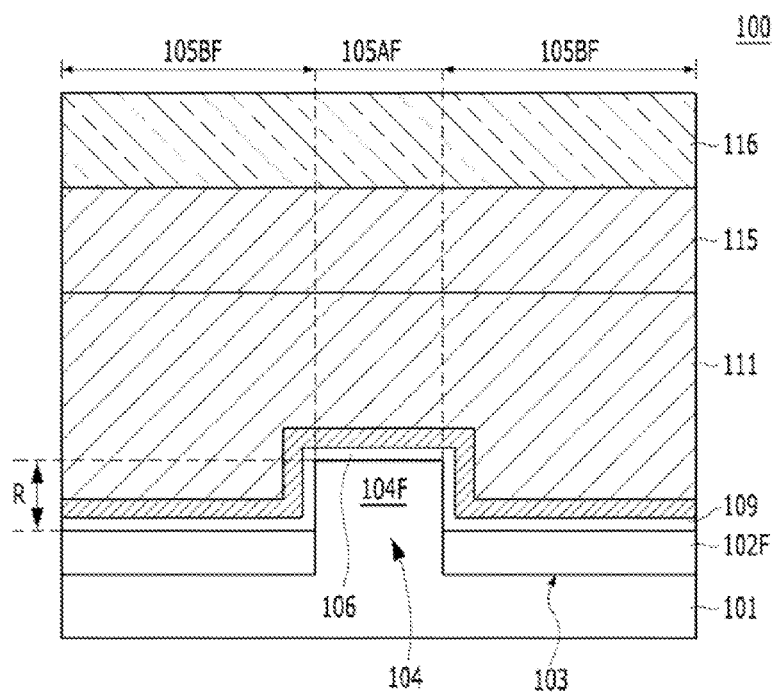

FIGS. 3A and 3B are cross-sectional views illustrating a buried gate type fin channel transistor to which the first embodiment is applied. FIG. 3A is a cross-sectional view along the line A-A' of FIG. 1. FIG. 3B is a cross-sectional view along the line B-B' of FIG. 1. Some components of a semiconductor device 100 may be the same as those of the semiconductor device 100 in accordance with the first embodiment. In FIGS. 2A to 3B, like reference numerals are used to refer to the same elements.

Referring to FIGS. 3A and 3S, a gate trench 105 includes a first trench 105AF and a second trench 105BF. The first trench 105AF is formed in an active region 104. The second trench 105BF is formed in an isolation layer 102. The second trench 105BF may continuously extend from the first trench 105AF. In the gate trench 105, the bottom surfaces of the first trench 105AF and the second trench 105BF may be positioned at different levels from the top surface of the active region 104. For example, the bottom surface of the first trench 105AF may be positioned at a level higher than the bottom surface of the second trench 105BF. The difference in the depths of the first trench 105AF and the second trench 105BF is induced as the isolation layer 102 is recessed. Accordingly, the second trench 105BF may include a recess region R which has a bottom surface lower than the bottom surface of the first trench 105AF.

A fin region 104F is formed in the active region 104 due to the difference in the depths of the first trench 105AF and the second trench 105BF. Therefore, the active region 104 includes the fin region 104F.

In this way, the fin region 104F is formed below the first trench 105AF, and the sidewalls of the fin region 104F are exposed by the recessed isolation layer 102F. The fin region 104F is a portion where a channel is formed. The fin region 104F is referred to as a saddle fin. By forming the fin region 104F, a channel width may be increased, and an electrical characteristic may be improved.

A gate structure 100G of the semiconductor device 100 includes a gate dielectric layer 106, a gate electrode 107, and a capping layer 116. The gate electrode 107 may include a lower buried portion 108 and an upper buried portion 112. The gate dielectric layer 106 may be formed on the sidewalls and the top surface of the fin region 104F. The lower buried portion 108 may be formed on both the sidewalls and the top surface of the fin region 104F. The lower buried portion 108 is formed in the gate trench 105 while filling the recess region R. The cross-sectional area of the lower buried portion 108 may be larger in the isolation layer 102 than in the active region 104. The upper buried portion 112 is not positioned around the sidewalls of the fin region 104F. The channel dose of the fin region 104F is influenced by a first work function liner 109.

FIGS. 4A to 4E are cross-sectional views illustrating modifications of the first embodiment. Some components of semiconductor devices 100 according to the modifications of the first embodiment may be the same as those of the semiconductor device 100 in accordance with the first embodiment. The remaining components except gate structures 1001G, 1002G, 1003G, 1004G and 1005G may be the same as those of the first embodiment.

Figure 4A:
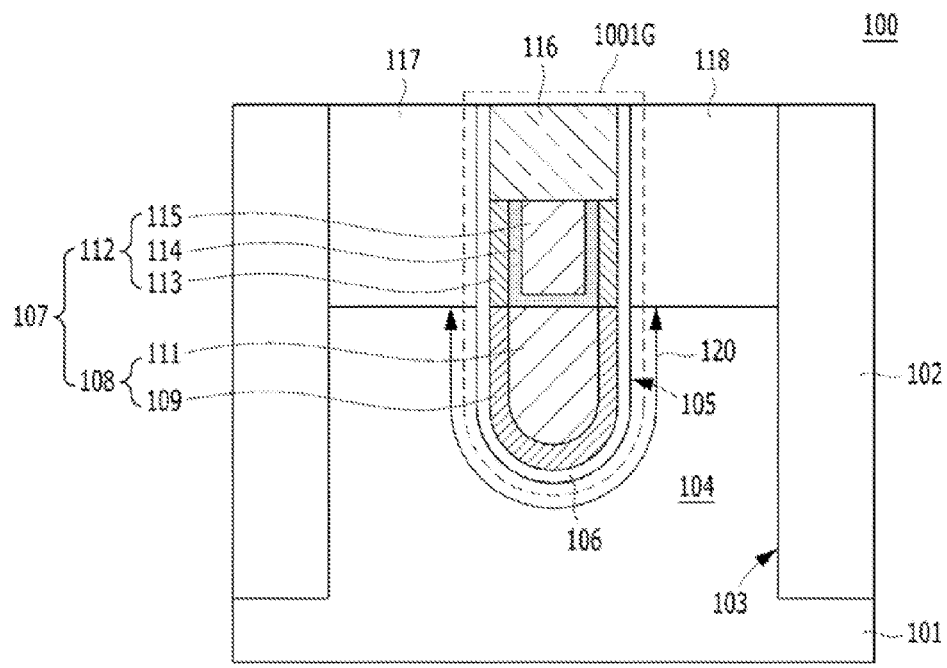
FIGS. 4A to 4E are cross-sectional views illustrating modifications of the first embodiment.

Referring to FIG. 4A, the gate structure 1001G of the semiconductor device 100 in accordance with a first modification may include a gate dielectric layer 106, a gate electrode 107, and a capping layer 116. The gate electrode 107 may fill a lower part of a gate trench 105, and the capping layer 116 may fill an upper part of the gate trench 105 over the gate electrode 107. The gate electrode 107 may include a lower buried portion 108 and an upper buried portion 112.

The lower buried portion 108 may include a first work function liner 109 and a first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level.

The upper buried portion 112 may include a second work function liner 113, an upper barrier 114, and a second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The top surfaces of the second work function liner 113 and the second low resistivity electrode 115 may be positioned at the same level. The upper barrier 114 may be disposed between the second work function liner 113 and the second low resistivity electrode 115, and between the first low resistivity electrode 111 and the second low resistivity electrode 115.

In the first modification, the second low resistivity electrode 115 may be formed of a material which has a low resistivity and is reactive with the second work function liner 113. That is, the second low resistivity electrode 115 may be formed of a material which is easily reacts with the second work function liner 113. For example, tungsten may be used as the second low resistivity electrode 115. Tungsten silicide may be formed since silicon of the second work function liner 113 and tungsten of the second low resistivity electrode 115 react with each other. A resistivity may increase by tungsten silicide. Therefore, to prevent such silicide reaction, the upper barrier 114 is disposed between the second low resistivity electrode 115 and the second work function liner 113. The upper barrier 114 may be formed of a material which has a specific resistivity lower than the second work function liner 113.

In this way, the second low resistivity electrode 115 may be formed of a low resistivity metal-containing material which has a specific resistivity lower than the second work function liner 113 and is reactive with the second work function liner 113.

The first low resistivity electrode 111 may be formed of a low resistivity metal-containing material which has a specific resistivity lower than the first and second work function liners 109 and 113 and is non-reactive with the second work function liner 113. In addition, the first low resistivity electrode 111 may be formed of a material which does not attack the gate dielectric layer 106.

According to the first modification, the first work function liner 109 may include titanium aluminum nitride, and the second work function liner 113 may include N-type doped polysilicon. The first low resistivity electrode 111 may include titanium nitride. The second low resistivity electrode 115 may include tungsten. The upper barrier 114 may include titanium nitride.

Figure 4B:
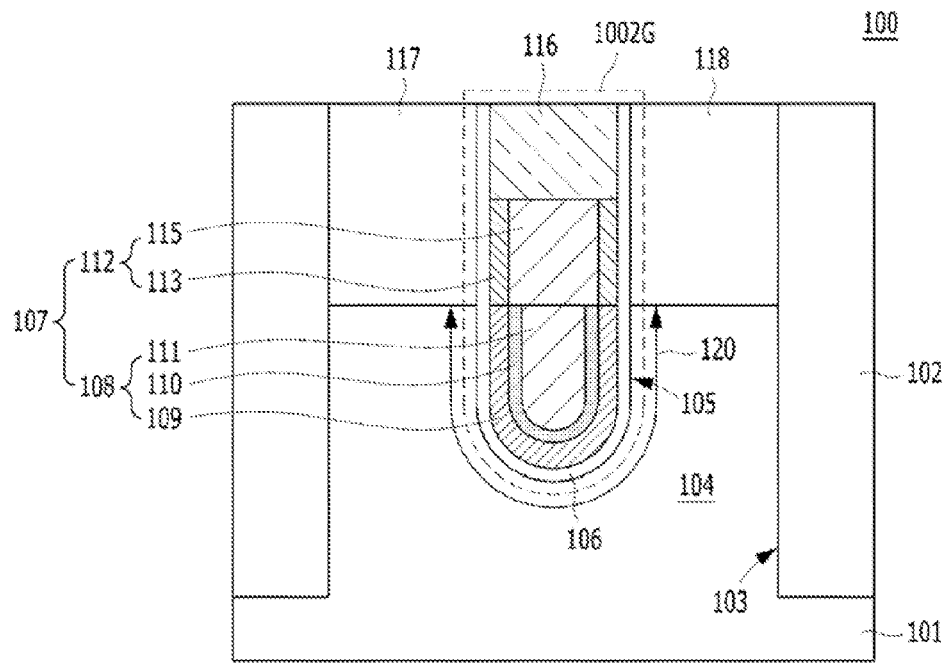

Referring to FIG. 4B, the gate structure 1002G of the semiconductor device 100 in accordance with a second modification may include a gate dielectric layer 106, a gate electrode 107, and a capping layer 116. The gate electrode 107 may fill a lower part of a gate trench 105, and the capping layer 116 may fill an upper part of the gate trench 105 over the gate electrode 107. The gate electrode 107 may include a lower buried portion 108 and an upper buried portion 112.

The lower buried portion 108 may include a first work function liner 109, a lower barrier 110, and a first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level. The lower barrier 110 may be disposed between the first work function liner 109 and the first low resistivity electrode 111.

The upper buried portion 112 may include a second work function liner 113 and a second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The top surfaces of the second work function liner 113 and the second low resistivity electrode 115 may be positioned at the same level.

In the second modification, the first low resistivity electrode 111 may be formed of a material which has a low resistivity and includes an impurity attacking the gate dielectric layer 106. For example, tungsten may be used as the first low resistivity electrode 111. When tungsten is deposited by using a source gas such as tungsten hexafluoride (WF$_6$), the gate dielectric layer 106 may be attacked by fluorine. Therefore, to prevent such fluorine attack, the lower barrier 110 is disposed between the first low resistivity electrode 111 and the first work function liner 109. While the first work function liner 109 may serve as a barrier for preventing fluorine attack, fluorine attack may be further prevented by the lower barrier 110. The lower barrier 110 may be formed of a material which has a low specific resistivity.

The second low resistivity electrode 115 may be formed of a low resistivity metal-containing material which has a specific resistivity lower than the first and second work function liners 109 and 113 and is non-reactive with the second work function liner 113. Accordingly, the upper barrier 114 of FIG. 4A is not needed.

According to the second modification, the first work function liner 109 may include titanium aluminum nitride, and the second work function liner 113 may include N-type doped polysilicon. The first low resistivity electrode 111 may include tungsten. The second low resistivity electrode 115 may include titanium nitride. The lower barrier 110 may include titanium nitride.

Figure 4C:
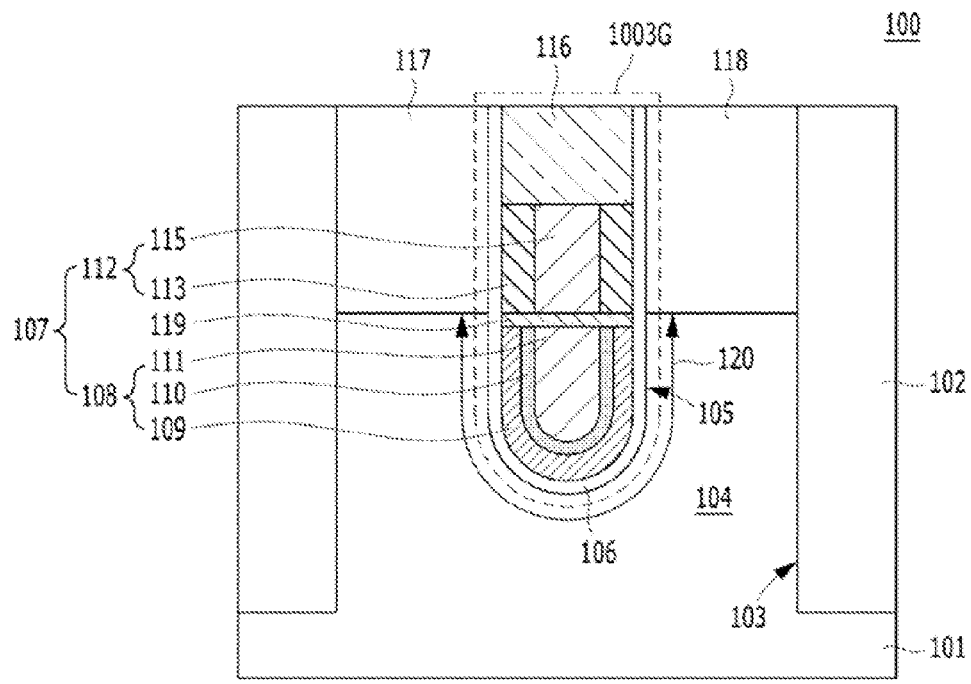

Referring to FIG. 4C, the buried gate structure 1003G of the semiconductor device 100 in accordance with a third modification may include a gate dielectric layer 106, a gate electrode 107, and a capping layer 116. The gate electrode 107 may fill a lower part of a gate trench 105, and the capping layer 116 may fill an upper part of the gate trench 105 over the gate electrode 107. The gate electrode 107 may include a lower buried portion 108, an upper buried portion 112, and an intermediate barrier 119 between the lower buried portion 108 and the upper buried portion 112.

The lower buried portion 108 may include a first work function liner 109, a lower barrier 110, and a first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level. The lower barrier 110 may be disposed between the first work function liner 109 and the first low resistivity electrode 111.

The upper buried portion 112 may include a second work function liner 113 and a second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The top surfaces of the second work function liner 113 and the second low resistivity electrode 115 may be positioned at the same level.

The first low resistivity electrode 111 may be formed of a material which has a low resistivity and includes an impurity attacking the gate dielectric layer 106. For example, tungsten may be used as the first low resistivity electrode 111. When tungsten is deposited by using a source gas such as tungsten hexafluoride (WF$_6$), the gate dielectric layer 106 may be attacked by fluorine. Therefore, to prevent such fluorine attack, the lower barrier 110 is disposed between the first low resistivity electrode 111 and the first work function liner 109. While the first work function liner 109 may serve as a barrier for preventing fluorine attack, fluorine attack may be further prevented by the lower barrier 110. The lower barrier 110 may be formed of a material which has a low specific resistivity.

The second low resistivity electrode 115 may be formed of a low resistivity metal-containing material which has a specific resistivity lower than the first and second work function liners 109 and 113 and is non-reactive with the second work function liner 113.

The third modification may include the intermediate barrier 119. The intermediate barrier 119 may be disposed between the lower buried portion 108 and the upper buried portion 112. The reaction of the second work function liner 113 and the first low resistivity electrode 111 may be prevented by the intermediate barrier 119. In the case where the thickness of the second work function liner 113 is thick, the second work function liner 113 and the first low resistivity electrode 111 may contact each other. Accordingly, to prevent the reaction of the second work function liner 113 and the first low resistivity electrode 111, the intermediate barrier 119 may be formed. The intermediate barrier 119 may be formed of a material which is non-reactive with the second work function liner 113. The intermediate barrier 119 may be formed of titanium nitride.

According to the third modification, the first work function liner 109 may include titanium aluminum nitride, and the second work function liner 113 may include N-type doped polysilicon. The first low resistivity electrode 111 may include tungsten. The second low resistivity electrode 115 may include titanium nitride. The lower barrier 110 and the intermediate barrier 119 may include titanium nitride.

Figure 4D:
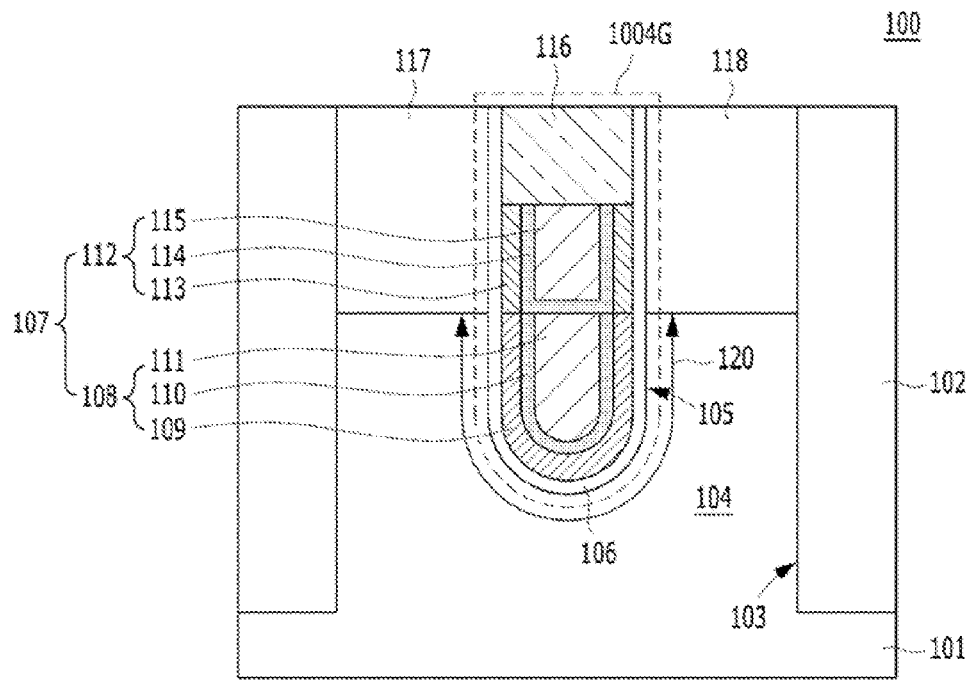

Referring to FIG. 4D, the buried gate structure 1004G of the semiconductor device 100 in accordance with a fourth modification may include a gate dielectric layer 106, a gate electrode 107, and a capping layer 116. The gate electrode 107 may fill a lower part of a gate trench 105, and the capping layer 116 may fill an upper part of the gate trench 105 over the gate electrode 107. The gate electrode 107 may include a lower buried portion 108 and an upper buried portion 112.

The lower buried portion 108 may include a first work function liner 109, a lower barrier 110, and a first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level. The lower barrier 110 may be disposed between the first work function liner 109 and the first low resistivity electrode 111.

The upper buried portion 112 may include a second work function liner 113, an upper barrier 114, and a second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The upper barrier 114 may be disposed between the second work function liner 113 and the second low resistivity electrode 115, and between the first low resistivity electrode 111 and the second low resistivity electrode 115. The top surfaces of the second work function liner 113 and the second low resistivity electrode 115 may be positioned at the same level.

The first low resistivity electrode 111 may be formed of a material which has a low resistivity and includes an impurity attacking the gate dielectric layer 106. Therefore, the lower barrier 110 is disposed between the first low resistivity electrode 111 and the first work function liner 109. The first low resistivity electrode 111 may include tungsten. The first low resistivity electrode 111 may be a reactive material to the second work function liner 113.

The second low resistivity electrode 115 may be formed of a material which has a low resistivity and is reactive with the second work function liner 113. Therefore, the upper barrier 114 is disposed between the second low resistivity electrode 115 and the second work function liner 113.

As described above, the first low resistivity electrode 111 and the second low resistivity electrode 115 may be formed of a material which is reactive with the second work function liner 113. To prevent attack to the gate dielectric layer 106, the lower barrier 110 may be formed. To prevent the reaction of the second low resistivity electrode 115 and the second work function liner 113, the upper barrier 114 may be formed.

Figure 4E:
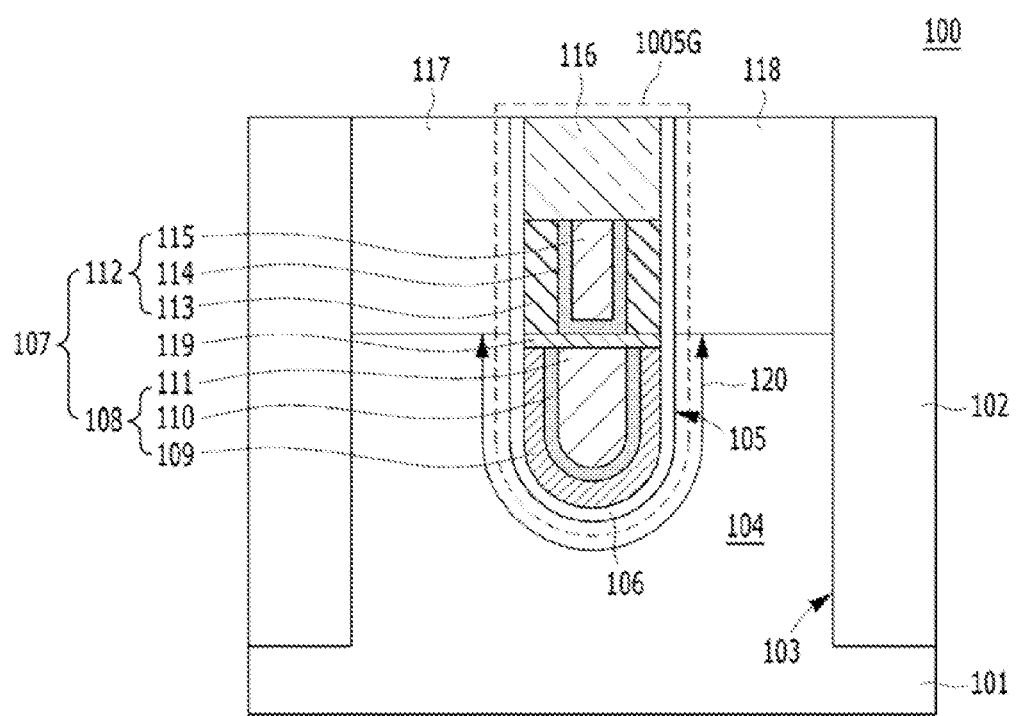

Referring to FIG. 4E, the buried gate structure 1005G of the semiconductor device 100 in accordance with a fifth modification may include a gate dielectric layer 106, a gate electrode 107, and a capping layer 116. The gate electrode 107 may fill a lower part of a gate trench 105, and the capping layer 116 may fill an upper part of the gate trench 105 over the gate electrode 107. The gate electrode 107 may include a lower buried portion 108, an upper buried portion 112, and an intermediate barrier 119.

The lower buried portion 108 may include a first work function liner 109, a lower barrier 110, and a first low resistivity electrode 111. The first low resistivity electrode 111 may partially fill the lower part of the gate trench 105. The first work function liner 109 may be disposed between the first low resistivity electrode 111 and the gate dielectric layer 106. The top surfaces of the first work function liner 109 and the first low resistivity electrode 111 may be positioned at the same level. The lower barrier 110 may be disposed between the first work function liner 109 and the first low resistivity electrode 111.

The upper buried portion 112 may include a second work function liner 113, an upper barrier 114, and a second low resistivity electrode 115. The second low resistivity electrode 115 may fill the remaining lower part of the gate trench 105 on the lower buried portion 108. The second work function liner 113 may be disposed between the second low resistivity electrode 115 and the gate dielectric layer 106. The second work function liner 113 may have a shape of spacers which are respectively disposed on both sidewalls of the gate trench 105. The second work function liner 113 may not be disposed between the first low resistivity electrode 111 and the second low resistivity electrode 115. The upper barrier 114 may be disposed between the second work function liner 113 and the second low resistivity electrode 115, and between the first low resistivity electrode 111 and the second low resistivity electrode 115. The top surfaces of the second work function liner 113 and the second low resistivity electrode 115 may be positioned at the same level.

The intermediate barrier 119 may be disposed between the lower buried portion 108 and the upper buried portion 112.

The first low resistivity electrode 111 may be formed of a material which has a low resistivity and includes an impurity attacking the gate dielectric layer 106. Therefore, the lower barrier 110 is disposed between the first low resistivity electrode 111 and the first work function liner 109. The first low resistivity electrode 111 may include tungsten. The first low resistivity electrode 111 may be a reactive material to the second work function liner 113. In the case where the thickness of the second work function liner 113 is thick, the second work function liner 113 and the first low resistivity electrode 111 may contact each other. Accordingly, the intermediate barrier 119 may be formed. The intermediate barrier 119 may be formed of a material which is non-reactive with the second work function liner 113.

The second low resistivity electrode 115 may be formed of a material which has a low resistivity and is reactive with the second work function liner 113. Therefore, the upper barrier 114 is disposed between the second low resistivity electrode 115 and the second work function liner 113.

As described above, the first low resistivity electrode 111 and the second low resistivity electrode 115 may be formed of a material which is reactive with the second work function liner 113. To prevent attack to the gate dielectric layer 106, the lower barrier 110 may be formed. To prevent the reaction of the second low resistivity electrode 115 and the second work function liner 113, the upper barrier 114 may be formed. To prevent the reaction of the first low resistivity electrode 111 and the second work function liner 113, the intermediate barrier 119 may be formed.

The above-described modifications may be applied to a buried gate type fin channel transistor.

Hereafter, a method for fabricating the semiconductor device in accordance with the first embodiment will be described.

FIGS. 5A to 5H are cross-sectional views describing a method for fabricating the semiconductor device shown in FIG. 1. FIGS. 5A to 5H are cross-sectional views along the line A-A' of FIG. 1, illustrating processing steps.

Figure 5A:
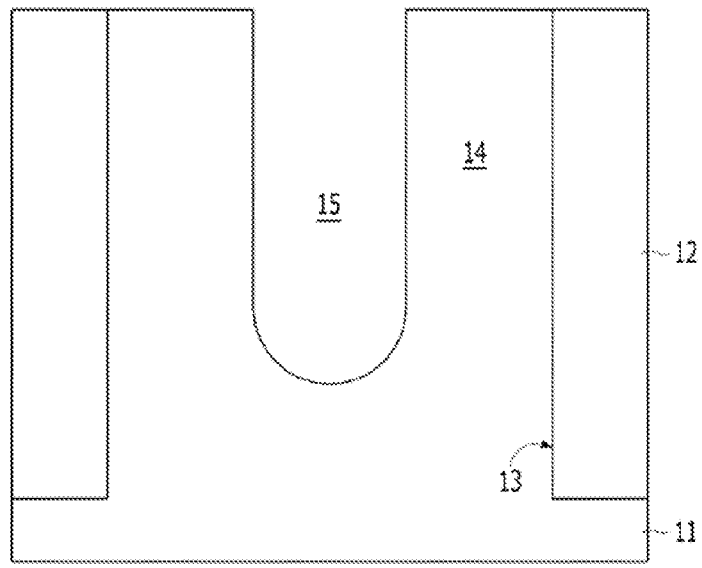
FIGS. 5A to 5H are cross-sectional views describing a method for fabricating the semiconductor device shown in FIG. 1.

As shown in FIG. 5A, an isolation layer 12 is formed in a substrate 11. An active region 14 is defined by the isolation layer 12. The isolation layer 12 may be formed by a shallow trench isolation (STI) process. For example, after forming a pad layer (not shown) on the substrate 11, the pad layer and the substrate 11 are etched by using an isolation mask (not shown). As a result, an isolation trench 13 is formed. The isolation trench 13 is filled with a dielectric material, and thus, the isolation layer 12 is formed. The isolation layer 12 may include silicon oxide, silicon nitride or a combination thereof. A chemical vapor deposition (CVD) process or another deposition process may be performed to fill the isolation trench 13 with the dielectric material. A planarization process such as chemical-mechanical polishing (CMP) process may be additionally performed.

A gate trench 15 is formed in the substrate 11. The gate trench 15 may be formed in a line shape across the active region 14 and the isolation layer 12. The gate trench 15 may be formed by forming a mask pattern (not shown) on the substrate 11 and performing an etching process using the mask pattern as an etch mask. The gate trench 15 may be formed to be shallower than the isolation trench 13. The gate trench 15 may have a depth enough to increase an average cross-sectional area of a gate electrode to be subsequently formed, and thus, the resistivity of the gate electrode may be decreased. The bottom of the gate trench 15 may have a curvature. By forming the gate trench 15 to have a curvature, a roughness at the bottom of the gate trench 15 may be minimized, and accordingly, filling of the gate electrode may be easily carried out. Furthermore, since the gate trench 15 has the curvature, angled shapes may be removed at the corners of the bottom of the gate trench 15 so that a concentration of an electric field may be mitigated.

Figure 5B:
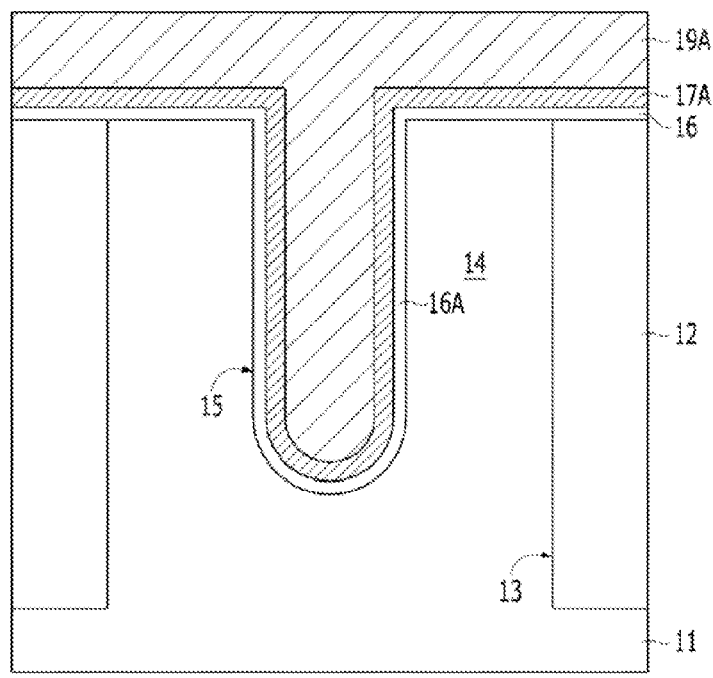

As shown in FIG. 5B, a gate dielectric layer 16A may be formed on a resultant structure including the gate trench 15. Before forming the gate dielectric layer 16A, a specific process may be performed to minimize/reduce etching damage to the surface of the gate trench 15. For example, after forming a sacrificial oxide (not shown) through a thermal oxidation process, the sacrificial oxide may be removed.

The gate dielectric layer 16A may be formed by a thermal oxidation process. In another embodiment, the gate dielectric layer 16A may be formed by a chemical vapor deposition (CVD) process or an atomic layer deposition (ALD) process. The gate dielectric layer 16A may include a high-k material, oxide, nitride, oxynitride or a combination thereof. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

A first work function liner layer 17A may be formed on the gate dielectric layer 16A. The first work function liner layer 17A may be conformally formed on the surface of the gate dielectric layer 16A. The first work function liner layer 17A has a work function greater than the mid-gap work function (4.5 eV) of silicon. The first work function liner layer 17A may be referred to as a high work function layer. The first work function liner layer 17A may be formed of a metal-containing material. The first work function liner layer 17A may include aluminum-containing titanium nitride. The aluminum-containing titanium nitride may be referred to as titanium aluminum nitride (TiAlN) or aluminum-doped titanium nitride (Al-doped TiN). As a method for forming the aluminum-doped titanium nitride (Al-doped TiN), after depositing titanium nitride (TiN), doping such as aluminum implantation may be performed. As a method for forming the titanium aluminum nitride (TiAlN), an aluminum-containing material may be added during a deposition process in which titanium nitride (TiN) is deposited, in such a way as to dope aluminum in situ. For example, when titanium nitride (TiN) is deposited by a chemical vapor deposition (CVD) process, a titanium source material, a nitrogen-containing material and an aluminum source material are simultaneously flowed. The titanium aluminum nitride (TiAlN) has a work function greater than the titanium nitride (TiN).

A first low resistivity layer 19A may be formed on the first work function liner layer 17A. The first low resistivity layer 19A may fill the gate trench 15. The first low resistivity layer 19A includes a low resistivity metal material. The first low resistivity layer 19A may be formed of a material which does not contain an impurity such as fluorine, to prevent attack to the gate dielectric layer 16A. Furthermore, the first low resistivity layer 19A may be formed of a non-reactive material to a second work function liner layer to be subsequently formed. The first low resistivity layer 19A may be formed of titanium nitride. The first low resistivity layer 19A may be formed by a chemical vapor deposition (CVD) process or an atomic layer deposition (ALD) process. In another embodiment, in the case where the first low resistivity layer 19A is formed of tungsten, since tungsten is deposited by using a source gas such as tungsten hexafluoride ($WF_6$), the gate dielectric layer 16A may be attacked by fluorine. To prevent such an attack to the gate dielectric layer 16A, a lower barrier layer may be formed in advance before forming the first low resistivity layer 19A. The lower barrier layer may be conformally formed on the surface of the first work function liner layer 17A. The lower barrier layer may be formed of a metal-containing material. The lower barrier layer may include a metal nitride. For example, the lower barrier layer may include titanium nitride. The lower barrier layer may become the lower barrier (110 of FIGS. 4B to 4E) by a first recessing process to be subsequently performed.

Figure 5C:
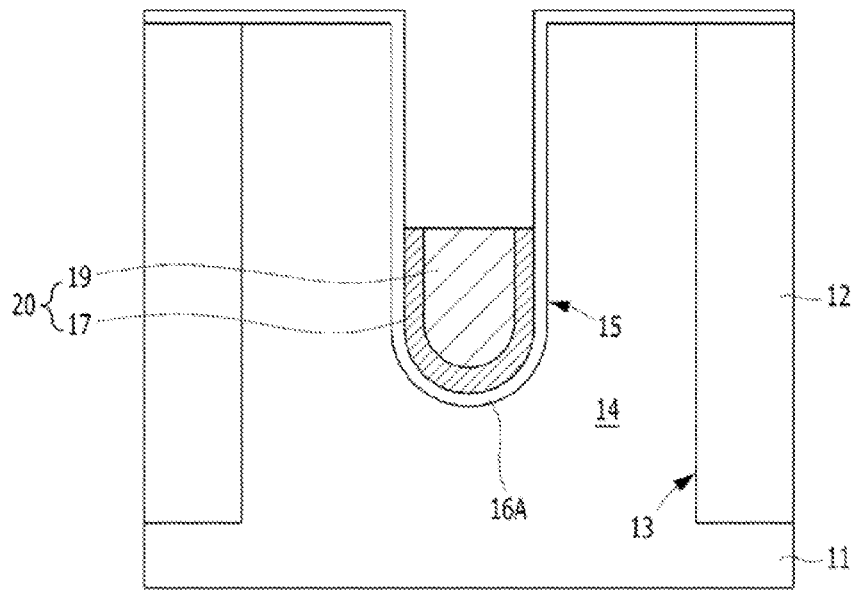

As shown in FIG. 5C, the first recessing process is performed in such a manner that a first work function liner 17 and a first low resistivity electrode 19 remain in the gate trench 15. The first recessing process may be performed by a dry etch process, for example, an etch-back process. The first work function liner 17 is formed by the etch-back process on the first work function liner layer 17A. The first low resistivity electrode 19 is formed by the etch-back process on the first low resistivity layer 19A. In another embodiment, the first recessing process may be performed in such a manner that, after a planarization process is performed, an etch-back process is subsequently performed.

A lower buried portion 20 is formed by the first recessing process described above. The lower buried portion 20 includes the first work function liner 17 and the first low resistivity electrode 19. The lower buried portion 20 may be recessed to be lower than the top surface of the active region 14.

Figure 5D:
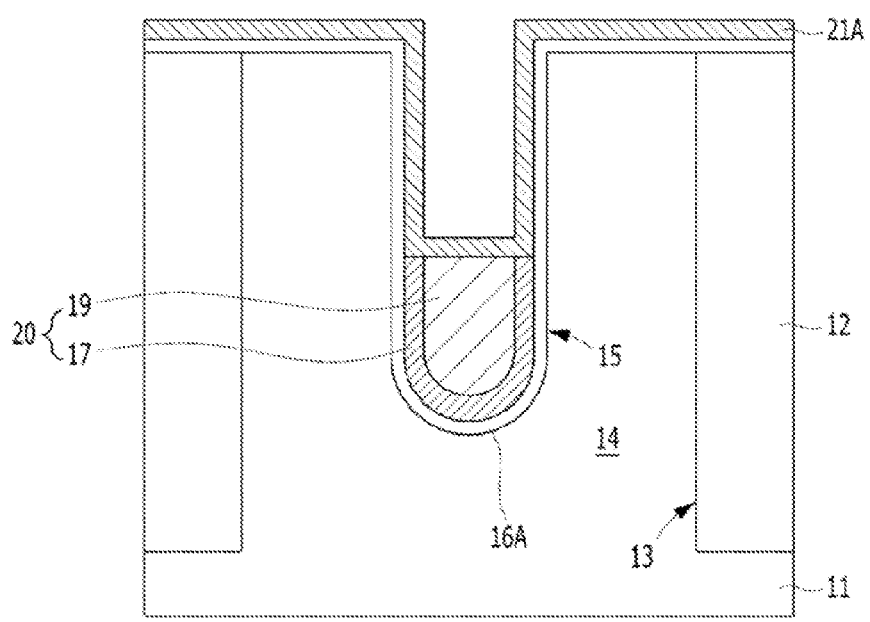

As shown in FIG. 5D, a second work function liner layer 21A may be formed. The second work function liner layer 21A may be conformally formed on the surfaces of the lower buried portion 20 and the gate dielectric layer 16A. The second work function liner layer 21A may be a work function material different from the first work function liner 17. The second work function liner layer 21A includes a low work function material. The second work function liner layer 21A may be formed of a non-metal material. The second work function liner layer 21A may include polysilicon doped with an N-type impurity.

Figure 5E:
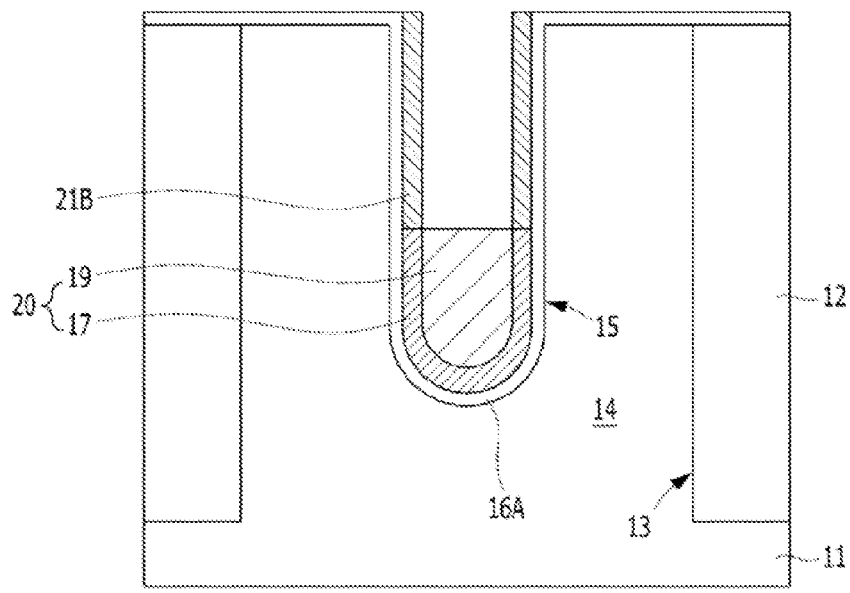

As shown in FIG. 5E, a second recessing process may be performed on the second work function liner layer 21A (shown in FIG. 5D). Namely, the second work function liner layer 21A may be etched. For example, the second work function liner layer 21A may be etched back. Accordingly, a preliminary second work function liner 21B may be formed on the sidewalls of the gate trench 15 over the first work function liner 17. The preliminary second work function liner 216 may have a shape of spacers. By the preliminary second work function liner 21B, the top surface of the first low resistivity electrode 19 may be exposed. The preliminary second work function liner 21B and the first work function liner 17 may contact each other. The preliminary second work function liner 21B and the first work function liner 17 may be formed to have the same thickness. The top surface of the preliminary second work function liner 21B may be positioned at the same level as the top surface of the active region 14.

Figure 5F:
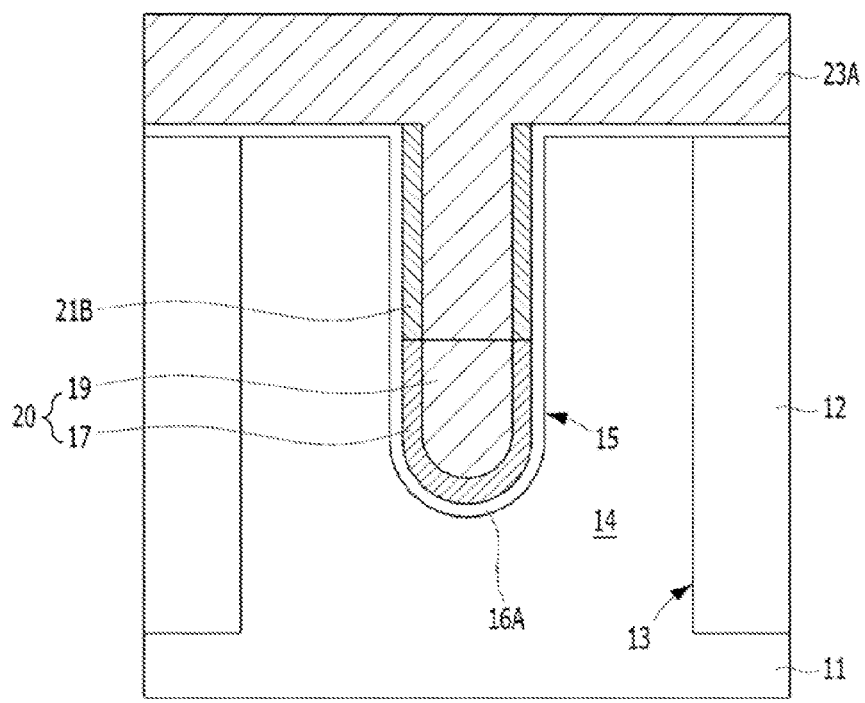

As shown in FIG. 5F, a second low resistivity layer 23A is formed on a resultant structure including the preliminary second work function liner 21B and the lower buried portion 20. The second low resistivity layer 23A may fill the remaining portion of the gate trench on the preliminary second work function liner 21B and the lower buried portion 20. The second low resistivity layer 23A may be formed of the same material as the first low resistivity electrode 19. The second low resistivity layer 23A includes a low resistivity metal material. The second low resistivity layer 23A may be formed of a non-reactive material to the preliminary second work function liner 21B. The second low resistivity layer 23A may be formed of titanium nitride. The second low resistivity layer 23A may be formed by a chemical vapor deposition (CVD) process or an atomic layer deposition (ALD) process. In another embodiment, in the case where the second low resistivity layer 23A is formed of a reactive material to the preliminary second work function liner 21B, such as tungsten, an upper barrier layer may be formed in advance before forming the second low resistivity layer 23A. The upper barrier layer may be conformally formed on the surfaces of the preliminary second work function liner 21B and the lower buried portion 20. The upper barrier layer may be formed of a metal-containing material. The upper barrier layer may include a metal nitride. For example, the upper barrier layer may include titanium nitride. The upper barrier layer may be formed of the same material as the lower barrier layer. The upper barrier layer may become the upper barrier (114 of FIGS. 4A, 4D and 4E) by a third recessing process to be subsequently performed.

Figure 5G:
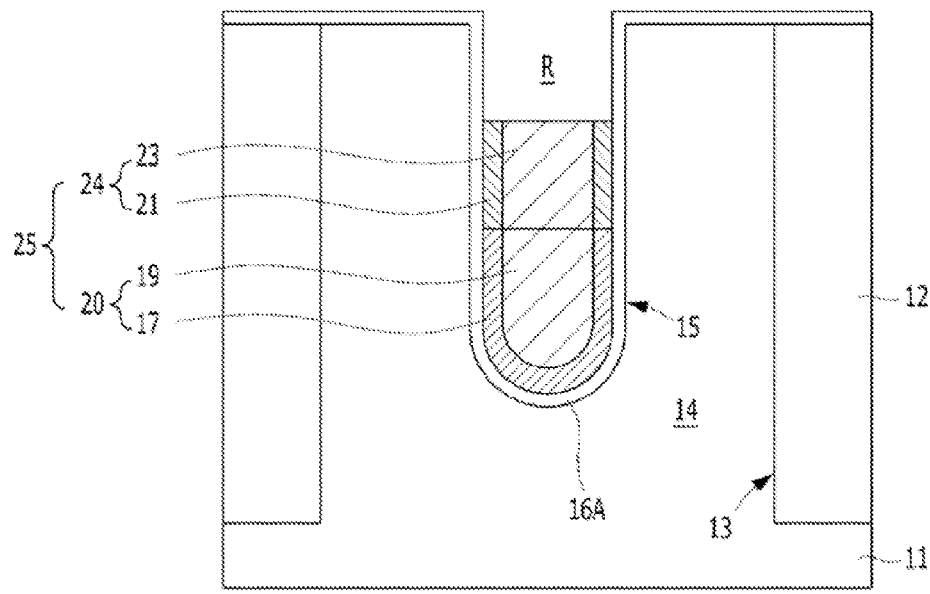

As shown in FIG. 5G, the third recessing process is performed in such a manner that a second work function liner 21 and a second low resistivity electrode 23 remain in the gate trench 15. The third recessing process may be performed by a dry etch process, for example, an etch-back process. The second low resistivity electrode 23 is formed by the etch-back process on the second low resistivity layer 23A. The second work function liner 21 is formed by the etch-back process on the preliminary second work function liner 21B. The third recessing process may be performed in such a manner that, after a planarization process is performed until the surface of the gate dielectric layer 16A on the top surface of the active region 14 is exposed, an etch-back process is subsequently performed. The top surfaces of the second low resistivity electrode 23 and the second work function liner 21 may be positioned at the same level. Accordingly, the second work function liner 21 may be overlap with first and second impurity regions to be subsequently formed.

By the third recessing process, an upper buried portion 24 is formed. The upper buried portion 24 includes the second work function liner 21 and the second low resistivity electrode 23. The upper buried portion 24 may be recessed to be lower than the top surface of the active region 14.

By the first recessing process, the second recessing process and the third recessing process, a buried gate electrode 25 is formed. The buried gate electrode 25 includes the lower buried portion 20 and the upper buried portion 24. Since the first work function liner 17 of a high work function and the second work function liner 21 of a low work function are included, the buried gate electrode 25 becomes a dual work function buried gate electrode.

Since the top surface of the buried gate electrode 25 is positioned at a level lower than the top surface of the active region 14, a recessed region R is formed. By forming the recessed region R on the buried gate electrode 25, the physical distance between the buried gate electrode 25 and a neighboring conductor, for example, a contact plug, may be sufficiently secured. As a result, it is possible to improve withstanding voltage between the buried gate electrode 25 and the neighboring conductor.

Figure 5H:
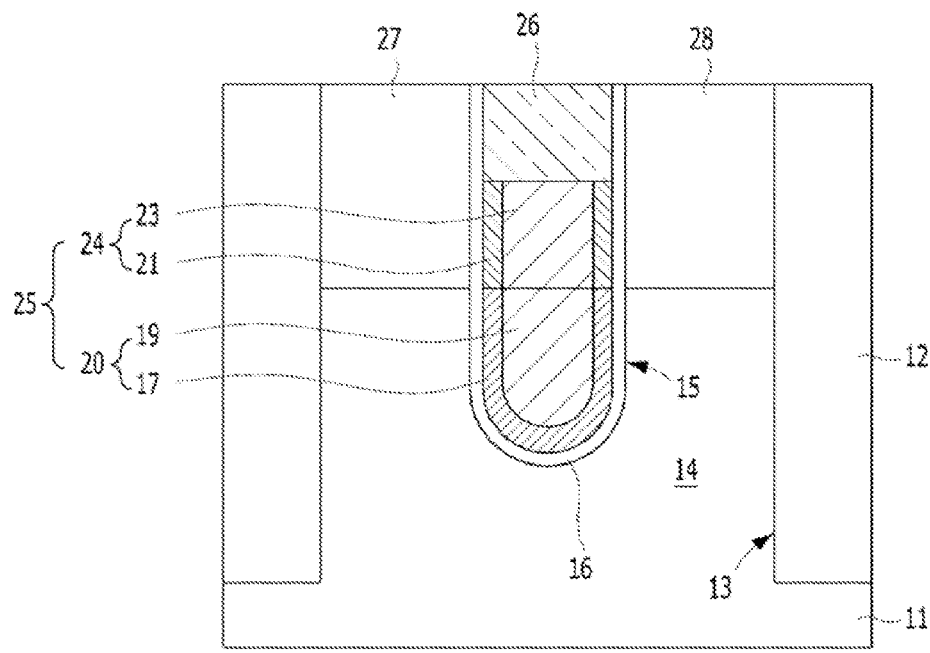

As shown in FIG. 5H, a capping layer 26 is formed on the buried gate electrode 25 to fill the recessed region R of the gate trench 15. The capping layer 26 includes a dielectric material. The capping layer 26 may include silicon nitride. As a method for forming the capping layer 26, after a preliminary capping layer (not shown) is formed on a resultant structure including the buried gate electrode 25, a planarization process on the preliminary capping layer may be performed until the top surface of the active region 14 is exposed. When or after performing the planarization process on the preliminary capping layer, the gate dielectric layer 16A on the top surface of the active region 14 may be removed to form a gate dielectric layer 16.

After forming the capping layer 26, an impurity doping process is performed by implantation or another doping technology. As a result, a first impurity region 27 and a second impurity region 28 are formed in the active region 14. When performing the impurity doping process, the capping layer 26 is used as a barrier. The first impurity region 27 and the second impurity region 28 respectively become a source region and a drain region. The gate dielectric layer 16A on the top surface of the active region 14 may be removed after the impurity doping process.

The bottom surfaces of the first impurity region 27 and the second impurity region 28 may have a depth that overlaps with the upper buried portion 24. Accordingly, the second work function liner 21 may overlap with the first and second impurity regions 27 and 28.

In another embodiment, the first impurity region 27 and the second impurity region 28 may be formed before forming the gate trench 15. For example, after forming an impurity region by doping an impurity into the active region 14 through using an ion implantation mask, the gate trench 15 may be formed. The impurity region may be divided into the first impurity region 27 and the second impurity region 28 by the gate trench 15.

Hereafter, a method for fabricating the semiconductor device according to the fifth modification of the first embodiment shown in FIG. 4E will be described.

FIGS. 6A to 6G are cross-sectional views describing a method for fabricating the semiconductor device 100 shown in FIG. 4E. A method for fabricating the remaining components except a buried gate electrode, will be referred to in FIGS. 5A to 5H.

Figure 6A:
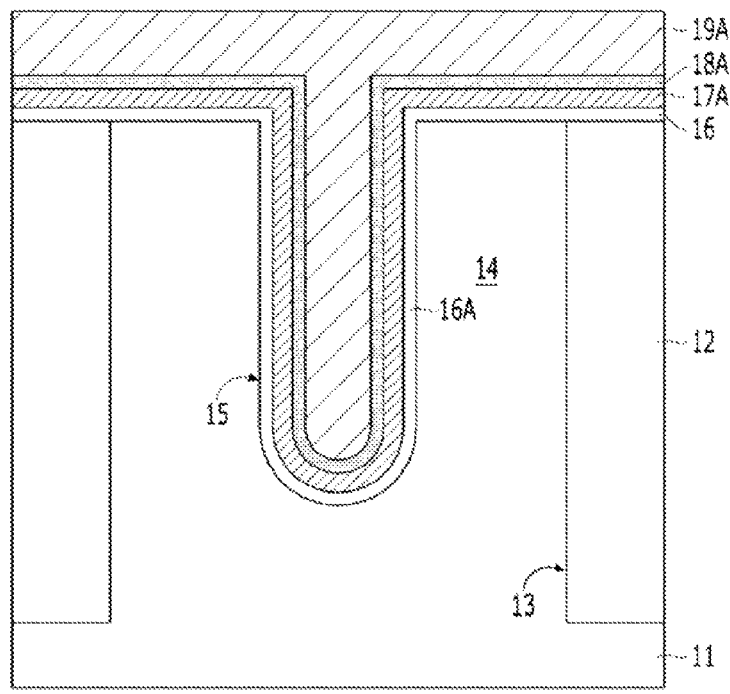
FIGS. 6A to 6G are cross-sectional views describing a method for fabricating the semiconductor device shown in FIG. 4E.

As shown in FIG. 6A, a gate dielectric layer 16A may be formed on the surface of a gate trench 15 and the top surfaces of the active region 14 and the isolation layer 12.

A first work function liner layer 17A may be formed on the gate dielectric layer 16A. The first work function liner layer 17A may be conformally formed on the surface of the gate dielectric layer 16A. The first work function liner layer 17A may be formed of titanium aluminum nitride (TiAlN).

A lower barrier layer 18A may be formed on the first work function liner layer 17A. The lower barrier layer 18A may be conformally formed on the surface of the first work function liner layer 17A. The lower barrier layer 18A and the first work function liner layer 17A may be different materials. The lower barrier layer 18A may be formed of a metal-containing material. The lower barrier layer 18A may include a metal nitride. For example, the lower barrier layer 18A may include titanium nitride.

A first low resistivity layer 19A may be formed on the lower barrier layer 18A. The first low resistivity layer 19A may fill the gate trench 15. The first low resistivity layer 19A includes a low resistivity metal material. The first low resistivity layer 19A may be formed of a reactive material to the first work function liner layer 17A and a second work function liner to be subsequently formed. The first low resistivity layer 19A may include tungsten. The first low resistivity layer 19A may be formed by a chemical vapor deposition (CVD) process or an atomic layer deposition (ALD) process.

Figure 6B:
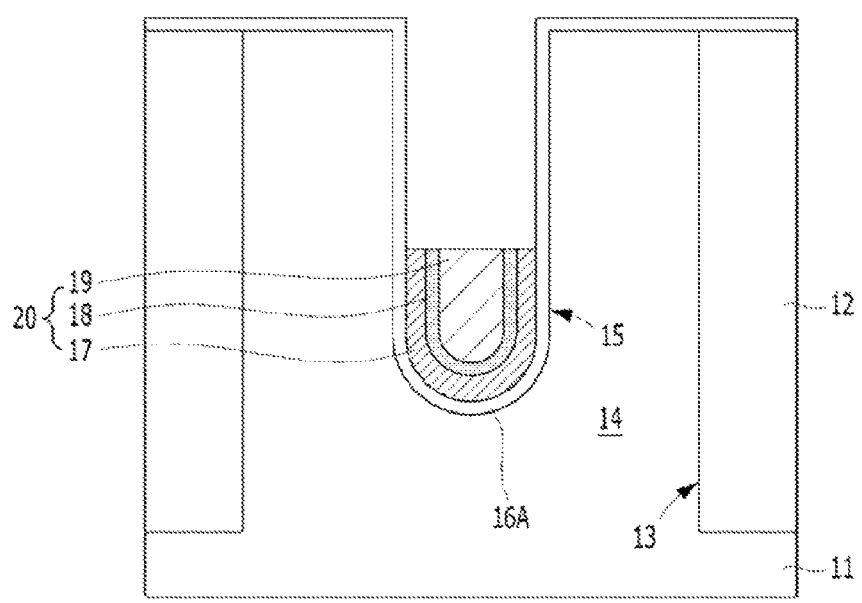

As shown in FIG. 6B, a first recessing process is performed in such a manner that a first work function liner 17, a lower barrier 18 and a first low resistivity electrode 19 remain in the gate trench 15. The first recessing process may be performed by a dry etch process, for example, an etch-back process. The first work function liner 17 is formed by the etch-back process on the first work function liner layer 17A. The first low resistivity electrode 19 is formed by the etch-back process on the first low resistivity layer 19A. The lower barrier 18 is formed by the etch-back process on the lower barrier layer 18A. In another embodiment, the first recessing process may be performed in such a manner that, after a planarization process is performed, an etch-back process is subsequently performed.

A lower buried portion 20 is formed by the first recessing process described above. The lower buried portion 20 includes the first work function liner 17, the lower barrier 18, and the first low resistivity electrode 19. The lower buried portion 20 may be recessed to be lower than the top surface of an active region 14.

Figure 6C:
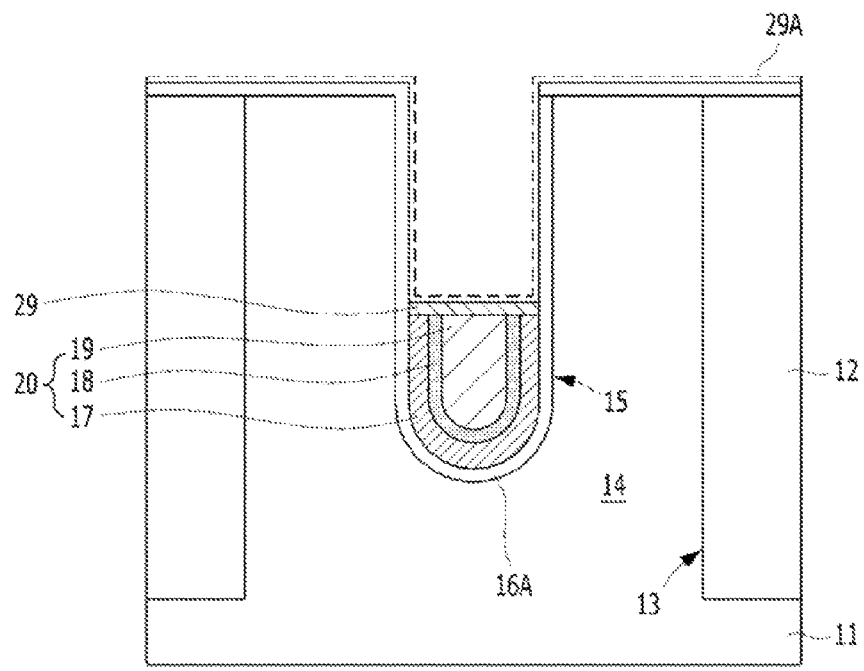

As shown in FIG. 6C, an intermediate barrier 29 may be formed. The intermediate barrier 29 may be formed on the top surface of the lower buried portion 20. For example, after an intermediate barrier layer 29A is formed on the entire surface of the substrate 11 including the lower buried portion 20, the intermediate barrier layer 29A may be etched so that the intermediate barrier 29 is formed on the top surface of the lower buried portion 20. The intermediate barrier 29 may be formed of a metal nitride. The Intermediate barrier 29 may be formed of titanium nitride. The Intermediate barrier layer 29A may be formed such that the thickness thereof on the top surface of the lower buried portion 20 is thicker than the thickness thereof on the other surfaces.

Figure 6D:
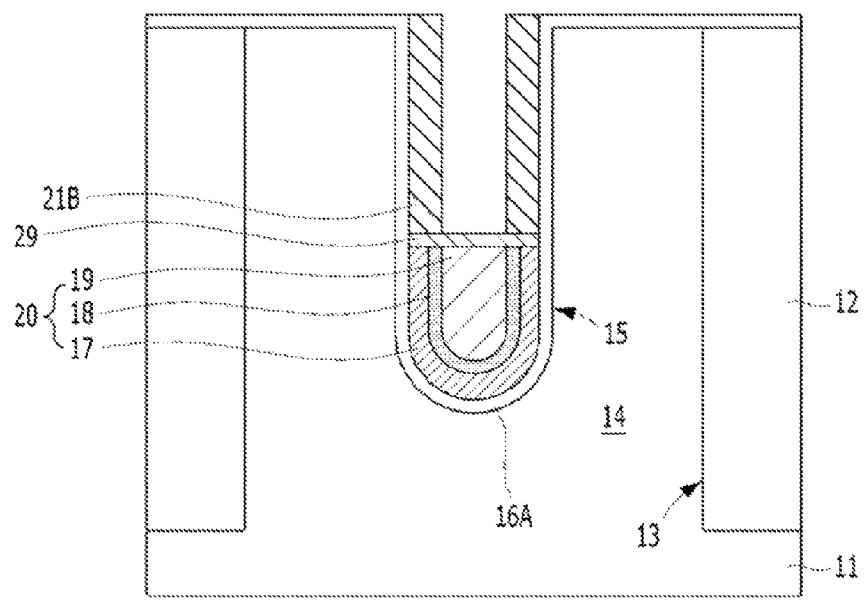

As shown in FIG. 6D, a preliminary second work function liner 21B may be formed. A method for forming the preliminary second work function liner 21B is shown in FIGS. 5D and 5E. The preliminary second work function liner 21B is formed by forming a second work function liner layer and performing a second recessing process. The preliminary second work function liner 21B includes a low work function material. The preliminary second work function liner 21B may be formed of a non-metal material. The preliminary second work function liner 21B may include polysilicon doped with an N-type impurity. The preliminary second work function liner 21B may have a shape of spacers.

Figure 6E:
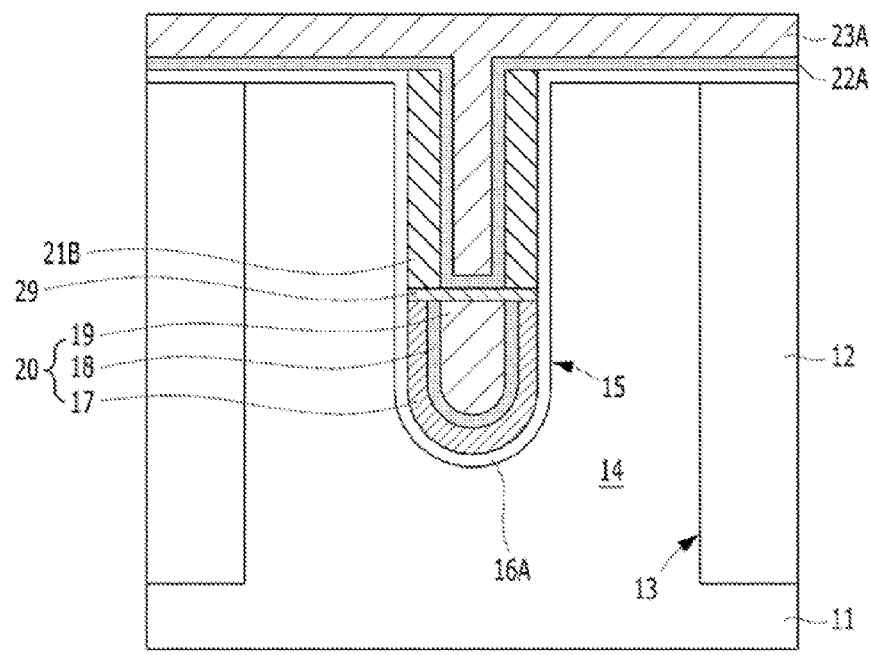

As shown in FIG. 6E, an upper barrier layer 22A and a second low resistivity layer 23A may be sequentially formed on a resultant structure including the preliminary second work function liner 21B and the intermediate barrier 29. The upper barrier layer 22A may be conformally formed. The second low resistivity layer 23A may fill the remaining portion of the gate trench 15 on the lower buried portion 20. The second low resistivity layer 23A may be formed of the same material as the first low resistivity electrode 19. The second low resistivity layer 23A includes a low resistivity metal material. The second low resistivity layer 23A may be formed of a reactive material to the preliminary second work function liner 21B. The second low resistivity layer 23A may include tungsten. The upper barrier layer 22A may be formed of a metal-containing material. The upper barrier layer 22A may include a metal nitride. For example, the upper barrier layer 22A may include titanium nitride. In another embodiment, the upper barrier layer 22A may be formed of the same material as the lower barrier 18.

Figure 6F:
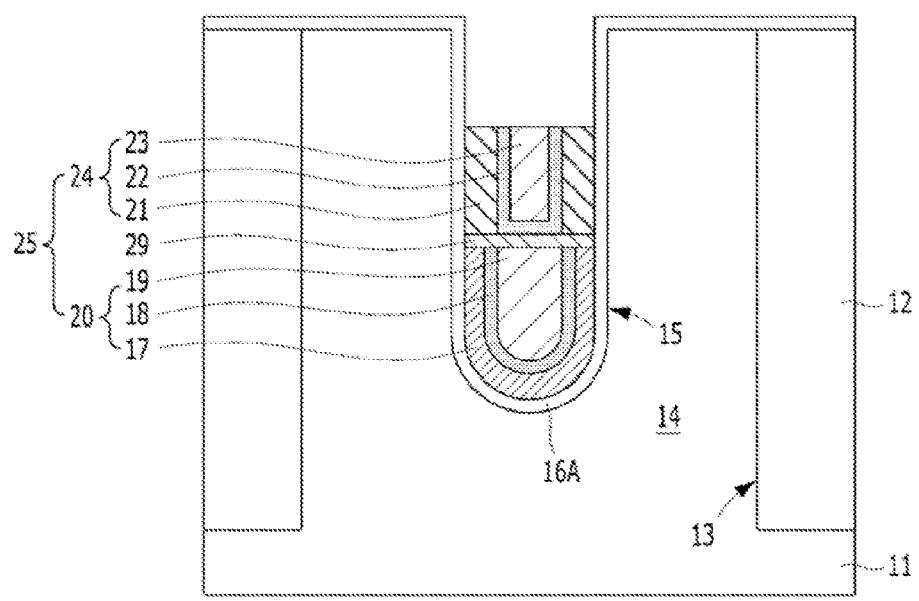

As shown in FIG. 6F, a third recessing process is performed in such a manner that a second work function liner 21, an upper barrier 22 and a second low resistivity electrode 23 remain in the gate trench 15. The third recessing process may be performed by a dry etch process, for example, an etch-back process. The second low resistivity electrode 23 is formed by the etch-back process on the second low resistivity layer 23A. The upper barrier 22 is formed by the etch-back process on the upper barrier layer 22A. The second work function liner 21 is formed by the etch-back process on the preliminary second work function liner 21B. The third recessing process may be performed in such a manner that, after a planarization process is performed until the surface of the gate dielectric layer 16A on the top surface of the active region 14 is exposed, an etch-back process is subsequently performed. The top surfaces of the second low resistivity electrode 23, the upper barrier 22 and the second work function liner 21 may be positioned at the same level.

By the third recessing process, an upper buried portion 24 is formed. The upper buried portion 24 includes the second work function liner 21, the upper barrier 22, and the second low resistivity electrode 23.

By the first recessing process to the third recessing process, a buried gate electrode 25 is formed. The buried gate electrode 25 includes the lower buried portion 20, the intermediate barrier 29, and the upper buried portion 24. Since the first work function liner 17 of a high work function and the second work function liner 21 of a low work function are included, the buried gate electrode 25 becomes a dual work function buried gate electrode.

Figure 6G:
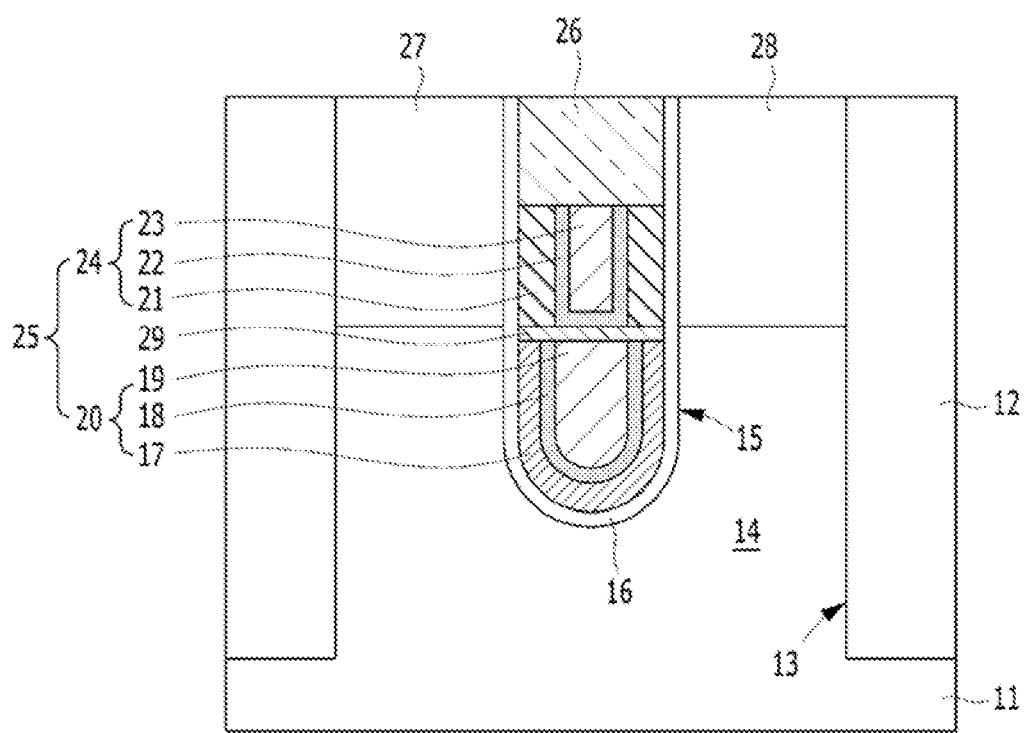

As shown in FIG. 6G, a capping layer 26 is formed on the buried gate electrode 25 to fill an upper part of the gate trench 15. The capping layer 26 includes a dielectric material. The capping layer 26 may include silicon nitride. As a method for forming the capping layer 26, after a preliminary capping layer (not shown) is formed on a resultant structure including the buried gate electrode 25, a planarization process on the preliminary capping layer may be performed until the top surface of the active region 14 is exposed. When or after performing the planarization process on the preliminary capping layer, the gate dielectric layer 16A on the top surface of the active region 14 may be removed to form a gate dielectric layer 16.

After forming the capping layer 26, an impurity doping process is performed by implantation or another doping technology. As a result, a first impurity region 27 and a second impurity region 28 are formed in the active region 14. When performing the impurity doping process, the capping layer 26 is used as a barrier. The first impurity region 27 and the second impurity region 28 respectively become a source region and a drain region. The gate dielectric layer 16A on the top surface of the active region 14 may be removed after the impurity doping process.

The bottom surfaces of the first impurity region 27 and the second impurity region 28 may have a depth that overlaps with the upper buried portion 24. Accordingly, the second work function liner 21 may overlap with the first and second impurity regions 27 and 28.

In another embodiment, the first impurity region 27 and the second impurity region 28 may be formed before forming the gate trench 15. For example, after forming an impurity region by doping an impurity into the active region 14 through using an ion implantation mask, the gate trench 15 may be formed. The impurity region may be divided into the first impurity region 27 and the second impurity region 28 by the gate trench 15.

Figure 7:
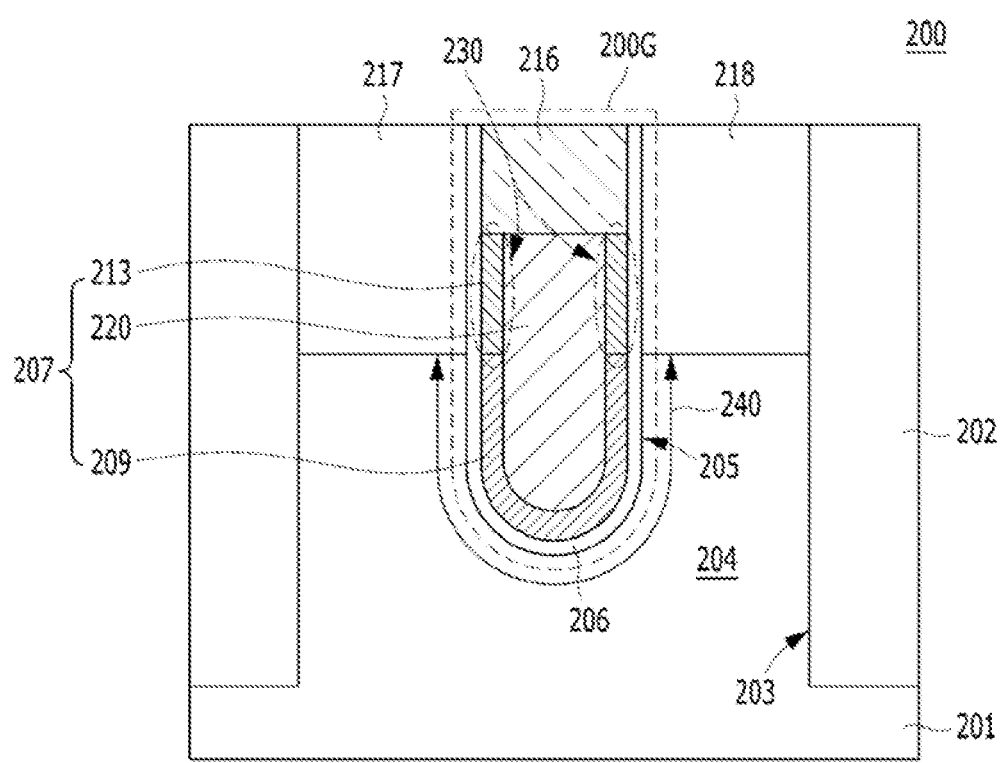
FIG. 7 is a cross-sectional view illustrating a semiconductor device in accordance with a second embodiment.

FIG. 7 is a cross-sectional view illustrating a semiconductor device in accordance with a second embodiment. FIG. 7 is a cross-sectional view along the line A-A' of FIG. 1, illustrating the semiconductor device in accordance with the second embodiment.

Some components of a semiconductor device 200 in accordance with the second embodiment may be the same as those of the semiconductor device 100 in accordance with the first embodiment. For example, the remaining components except a gate structure, may be the same as those of the first embodiment.

Referring to FIG. 7, the semiconductor device 200 in accordance with the second embodiment may include a gate structure 200G, a first impurity region 217, and a second impurity region 218. A gate trench 205 cross an active region 204 and an isolation layer 202 may be formed. The gate structure 200G may be formed in the gate trench 205. The first impurity region 217 and the second impurity region 218 may be separated from each other by the gate trench 205.

The gate structure 200G may include a gate dielectric layer 206, a gate electrode 207, and a capping layer 216. The top surface of the gate electrode 207 may be positioned at a level lower than the top surface of the active region 204. The gate electrode 207 may fill a lower part of the gate trench 205. The capping layer 216 may be disposed on the gate electrode 207 to fill an upper part of the gate trench 205. The gate dielectric layer 206 may be formed along the bottom surface and the sidewalls of the gate trench 205. A channel 240 may be formed along the gate electrode 207 between the first impurity region 217 and the second impurity region 218. The channel 240 has a channel length longer than a general planar type transistor. Accordingly, it is possible to prevent a short channel effect.

The gate electrode 207 may include a first work function liner 209, a single low resistivity electrode 220, and a second work function liner 213. In this way, the second embodiment has the single low resistivity electrode 220 unlike the first embodiment. The single low resistivity electrode 220 has a structure which is formed by one low resistivity layer whereas the first embodiment and the modifications thereof are applied to a dual low resistivity electrode which includes a first low resistivity electrode and a second low resistivity electrode.

The first work function liner 209 may be disposed between the single low resistivity electrode 220 and the gate dielectric layer 206. The top surface of the first work function liner 209 may be positioned at a level lower than the top surface of the single low resistivity electrode 220. The first work function liner 209 may overlap with the channel 240.

The second work function liner 213 may be disposed between the single low resistivity electrode 220 and the gate dielectric layer 206. The second work function liner 213 may have a shape of spacers which are respectively disposed on both sidewalls of the gate trench 205. The top surfaces of the second work function liner 213 and the single low resistivity electrode 220 may be positioned at the same level.

The capping layer 216 may be formed on the top surfaces of the single low resistivity electrode 220 and the second work function liner 213.

The first work function liner 209 and the second work function liner 213 may be conductive materials. The first work function liner 209 and the second work function liner 213 are formed of different work function materials. The first work function liner 209 may have a work function greater than the second work function liner 213. The first work function liner 209 may include a high work function material. The second work function liner 213 may include a low work function material. The high work function material is a material which has a work function greater than the mid-gap work function of silicon. The low work function material is a material which has a work function lower than the mid-gap work function of silicon. That is, the high work function material may have a work function greater than 4.5 eV, and the low work function material may have a work function lower than 4.5 eV. The first work function liner 209 may include a metal-containing material. The second work function liner 213 may include a non-metal material.

The first work function liner 209 may include a metal nitride, and the second work function liner 213 may include a silicon-containing material. The first work function liner 209 may contain a first work function adjustment species to have a high work function. The first work function adjustment species may include aluminum (Al). Accordingly, the first work function liner 209 may include a metal nitride which contains aluminum. The work function of a metal nitride which contains aluminum is greater than the work function of a metal nitride which does not contain aluminum. In the present embodiment, the first work function liner 209 may include aluminum-containing titanium nitride.

The aluminum-containing titanium nitride may be referred to as titanium aluminum nitride (TiAlN) or aluminum-doped titanium nitride (Al-doped TiN). As a method for forming the aluminum-doped titanium nitride (Al-doped TiN), after depositing titanium nitride (TiN), doping such as aluminum implantation may be performed. As a method for forming the titanium aluminum nitride (TiAlN), an aluminum-containing material may be added during a deposition process in which titanium nitride (TiN) is deposited, in such a way as to dope aluminum in situ. For example, when titanium nitride (TiN) is deposited by a chemical vapor deposition (CVD) process, a titanium source material, a nitrogen-containing material and an aluminum source material are simultaneously flowed. The first work function liner 209 may protect the gate dielectric layer 206 from the single low resistivity electrode 220.

The second work function liner 213 has a low work function. The second work function liner 213 may contain a second work function adjustment species to have a low work function. The second work function adjustment species may include an N-type dopant. Accordingly, the second work function liner 213 may include a silicon-containing material which contains an N-type dopant. In the present embodiment, the second work function liner 213 may include polysilicon, and, for example, may include polysilicon doped with an N-type dopant hereinafter, referred to as an N-type doped polysilicon. The N-type doped polysilicon has a low work function. The N-type dopant may include phosphorus (P) or arsenic (As). The second work function liner 213 may overlap with the first impurity region 217 and the second impurity region 218. For example, the second work function liner 213 may horizontally overlap with the first impurity region 217 and the second impurity region 218. The second work function liner 213 may fill gaps 230 between the single low resistivity electrode 220 and the gate dielectric layer 206. The gaps 230 may be disposed between the single low resistivity electrode 220 and the gate dielectric layer 206 over the first work function liner 209.

The single low resistivity electrode 220 includes a material which has a specific resistivity lower than the first work function liner 209 and the second work function liner 213. The single low resistivity electrode 220 may be formed of a low resistivity material. Accordingly, the resistivity of the gate electrode 207 is decreased by the single low resistivity electrode 220. The single low resistivity electrode 220 includes a low resistivity metal-containing material. To decrease the resistivity of the gate electrode 207, the second work function liner 213 may be formed to a thin thickness. As a result, the resistivity of the gate electrode 207 may be significantly decreased by increasing the volume of a metal material.

In the second embodiment, the single low resistivity electrode 220 may be formed of a non-reactive material to the second work function liner 213. That is, the single low resistivity electrode 220 may be formed of a material which does not react with the second work function liner 213.

In this way, the single low resistivity electrode 220 may be formed of a low resistivity metal-containing material which has a specific resistivity lower than the second work function liner 213 and is non-reactive with the second work function liner 213.

The single low resistivity electrode 220 may be formed of a low resistivity metal-containing material which has a specific resistivity lower than the first work function liner 209 and is non-reactive with the first work function liner 209. Moreover, the single low resistivity electrode 220 may be formed of a material which does not contain an impurity attacking the gate dielectric layer 206, such as fluorine.

The single low resistivity electrode 220 may be formed of titanium nitride. Since the single low resistivity electrode 220 is a non-reactive material to the second work function liner 213 and a material which does not contain fluorine, the gate electrode 207 may not need a barrier, and thus, be referred to as a barrier-less gate electrode.

FIGS. 8A to 8D are cross-sectional views illustrating modifications of the second embodiment. Some components of semiconductor devices 200 according to the modifications of the second embodiment may be the same as those of the semiconductor device 200 in accordance with the second embodiment. The remaining components except gate structures 2001G, 2002G, 2003G and 2004G may be the same as those of the second embodiment.

Figure 8A:
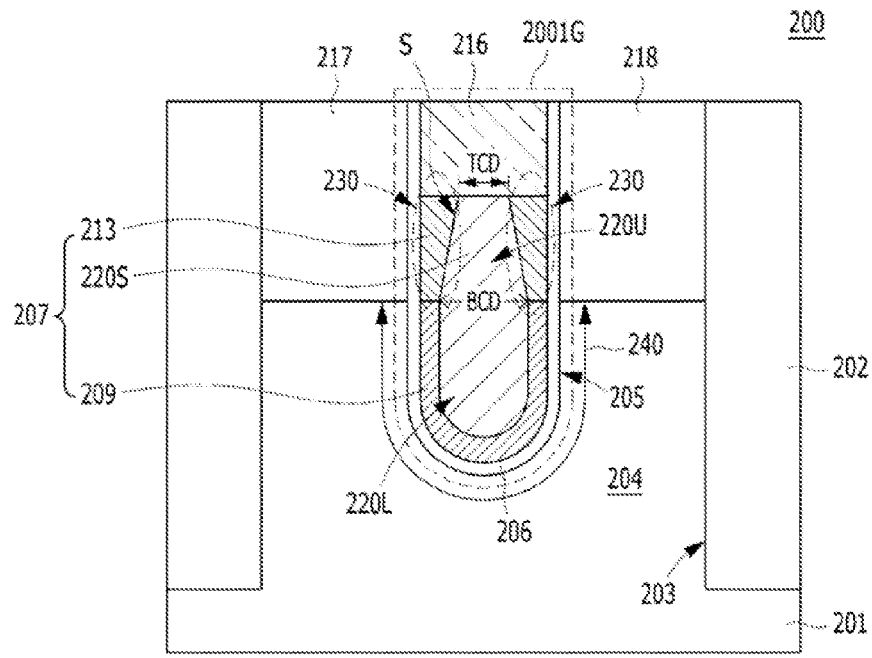
FIGS. 8A to 8D are cross-sectional views illustrating modifications of the second embodiment.

Referring to FIG. 8A, the gate structure 2001G of the semiconductor device 200 in accordance with a first modification may include a gate dielectric layer 206, a gate electrode 207, and a capping layer 216. The gate electrode 207 may include a first work function liner 209, a single low resistivity electrode 220S, and a second work function liner 213. The first work function liner 209 may include titanium aluminum nitride. The second work function liner 213 may include an N-type doped polysilicon. The first work function liner 209 may overlap with a channel 240. The second work function liner 213 may overlap with a first impurity region 217 and a second impurity region 218.

The single low resistivity electrode 220S may include a lower portion 220L and an upper portion 220U. The sidewalls of the lower portion 220L may have a vertical profile, and the sidewalls of the upper portion 220U may have a sloped profile (see the reference symbol 'S'). The sidewalls of the upper portion 220U may have a positive slope. For example, a top width TCD of the upper portion 220U may be smaller than a bottom width BCD of the upper portion 220U. The bottom width BCD of the upper portion 220U may be the same as the width of the lower portion 220L. In the lower portion 220L, a top width and a bottom width may be the same with each other.

In this way, since the upper portion 220U of the single low resistivity electrode 220S has the positive slope, the spaces of gaps 230 in which the second work function liner 213 is formed may be widened. Accordingly, the gap-fill margin of the second work function liner 213 may be secured. That is, it is possible to fill the gaps 230 with the second work function liner 213 without voids.

Figure 8B:
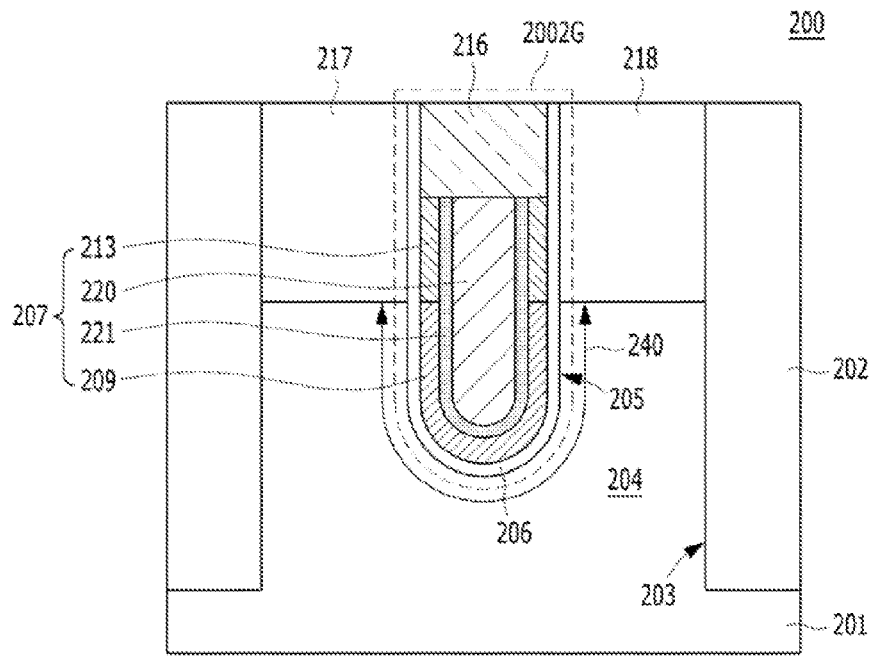

Referring to FIG. 8B, the gate structure 2002G of the semiconductor device 200 in accordance with a second modification may include a gate dielectric layer 206, a gate electrode 207, and a capping layer 216. The gate electrode 207 may include a first work function liner 209, a single low resistivity electrode 220, a second work function liner 213, and a barrier 221. The first work function liner 209 may overlap with a channel 240. The second work function liner 213 may overlap with a first impurity region 217 and a second impurity region 218. The second modification may include the barrier 221. The barrier 221 may contact the first work function liner 209 and the second work function liner 213. For example, the barrier 221 may be disposed between the first work function liner 209 and the single low resistivity electrode 220, and between the second work function liner 213 and the single low resistivity electrode 220.

The first work function liner 209 may include titanium aluminum nitride. The second work function liner 213 may include an N-type doped polysilicon.

The single low resistivity electrode 220 may be formed of a reactive material to the second work function liner 213. The barrier 221 may be formed of a material capable of preventing the reaction between the second work function liner 213 and the single low resistivity electrode 220. The single low resistivity electrode 220 may include tungsten, and the barrier 221 may include titanium nitride. By the barrier 221, the silicide reaction between the second work function liner 213 and the single low resistivity electrode 220 may be prevented.

Figure 8C:
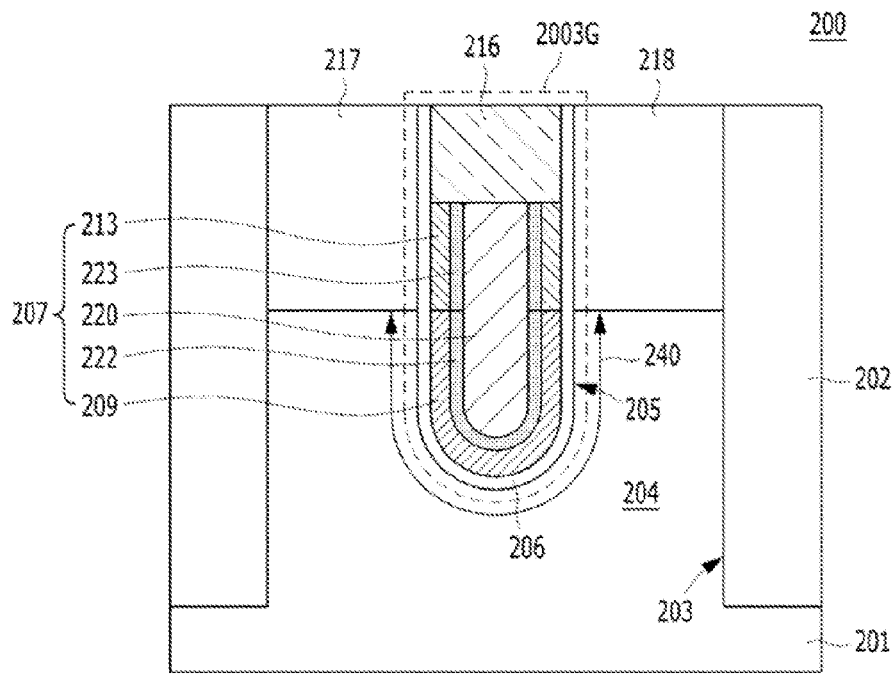

Referring to FIG. 8C, the gate structure 2003G of the semiconductor device 200 in accordance with a third modification may include a gate dielectric layer 206, a gate electrode 207, and a capping layer 216. The gate electrode 207 may include a first work function liner 209, a single low resistivity electrode 220, a second work function liner 213, a first barrier 222, and a second barrier 223. The first work function liner 209 may overlap with a channel 240. The second work function liner 213 may overlap with a first impurity region 217 and a second impurity region 218. The third modification may include the first barrier 222 and the second barrier 223. The first barrier 222 and the second barrier 223 may contact the single low resistivity electrode 220. The first barrier 222 may contact the bottom portion and the lower sidewalls of the single low resistivity electrode 220, and the second barrier 223 may contact the upper sidewalls of the single low resistivity electrode 220. The first barrier 222 may be disposed between the first work function liner 209 and the single low resistivity electrode 220. The second barrier 223 may be disposed between the second work function liner 213 and the single low resistivity electrode 220.

The first work function liner 209 may include titanium aluminum nitride. The second work function liner 213 may include an N-type doped polysilicon. The single low resistivity electrode 220 may be formed of a reactive material to the second work function liner 213. The single low resistivity electrode 220 may include tungsten.

The second barrier 223 may be formed of a material capable of preventing the reaction between the second work function liner 213 and the single low resistivity electrode 220. The second barrier 223 may include titanium nitride. By second the barrier 223, the silicide reaction between the second work function liner 213 and the single low resistivity electrode 220 may be prevented.

To prevent attack to the gate dielectric layer 206, the first barrier 222 is disposed between the single low resistivity electrode 220 and the first work function liner 209. The first barrier 222 may be formed of the same material as the second barrier 223. The first barrier 222 may include titanium nitride.

Figure 8D:
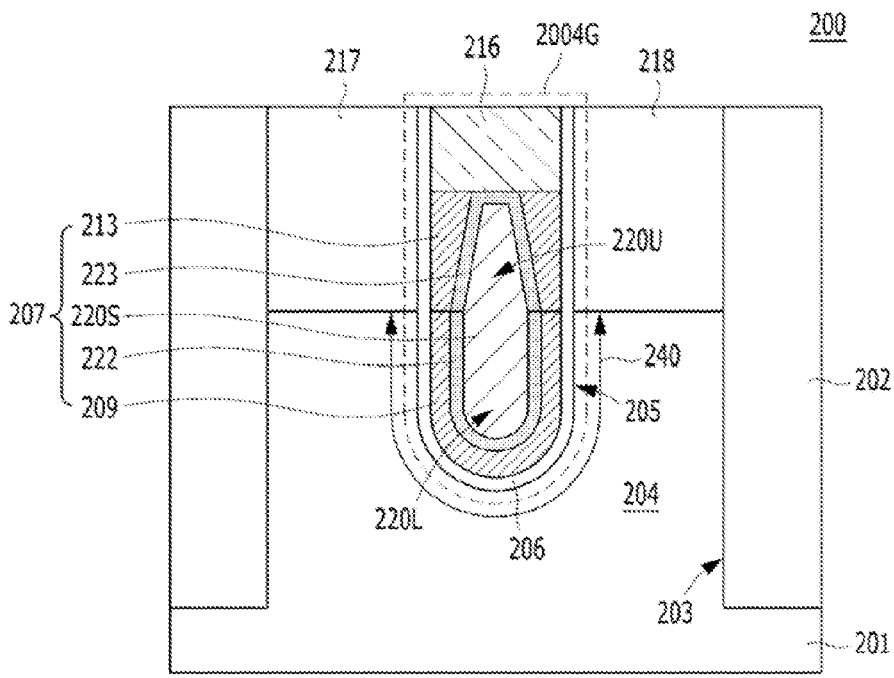

Referring to FIG. 8D, the gate structure 2004G of the semiconductor device 200 in accordance with a fourth modification may include a gate dielectric layer 206, a gate electrode 207, and a capping layer 216. The gate electrode 207 may include a first work function liner 209, a single low resistivity electrode 220S, a second work function liner 213, a first barrier 222, and a second barrier 223. The first work function liner 209 may overlap with a channel 240. The second work function liner 213 may overlap with a first impurity region 217 and a second impurity region 218. The fourth modification may include the first barrier 222 and the second barrier 223. The first barrier 222 and the second barrier 223 may contact the single low resistivity electrode 220S. The first barrier 222 may contact the bottom portion and the lower sidewalls of the single low resistivity electrode 220S, and the second barrier 223 may contact the upper sidewalls and the top surface of the single low resistivity electrode 220S. The first barrier 222 may be disposed between the first work function liner 209 and the single low resistivity electrode 220S. The second barrier 223 may be disposed between the second work function liner 213 and the single low resistivity electrode 220S, and disposed on the top surface of the single low resistivity electrode 220S.

The first work function liner 209 may include titanium aluminum nitride. The second work function liner 213 may include an N-type doped polysilicon. The single low resistivity electrode 220S may be formed of a reactive material to the second work function liner 213. The single low resistivity electrode 220S may include tungsten. The single low resistivity electrode 220S may include a lower portion 220L and an upper portion 220U. The sidewalls of the lower portion 220L may have a vertical profile, and the sidewalls of the upper portion 220U may have a sloped profile.

The second barrier 223 may be formed of a material capable of preventing the reaction between the second work function liner 213 and the single low resistivity electrode 220S. The second barrier 223 may include titanium nitride. By second the barrier 223, the silicide reaction between the second work function liner 213 and the single low resistivity electrode 220S may be prevented. The second barrier 223 may be formed on the top surface of the upper portion 220U of the single low resistivity electrode 220S. In another embodiment, the second barrier 223 may be disposed on the sidewalls of the upper portion 220U of the single low resistivity electrode 220S.

To prevent attack to the gate dielectric layer 206, the first barrier 222 is disposed between the single low resistivity electrode 220S and the first work function liner 209. The first barrier 222 may be formed of the same material as the second barrier 223. The first barrier 222 may include titanium nitride.

The above-described modifications may be applied to a buried gate type fin channel transistor.

FIGS. 9A to 9F are cross-sectional views describing a method for fabricating the semiconductor device shown in FIG. 7. FIGS. 9A to 9F are cross-sectional views along the line A-A' of FIG. 1, illustrating processing steps.

Figure 9A:
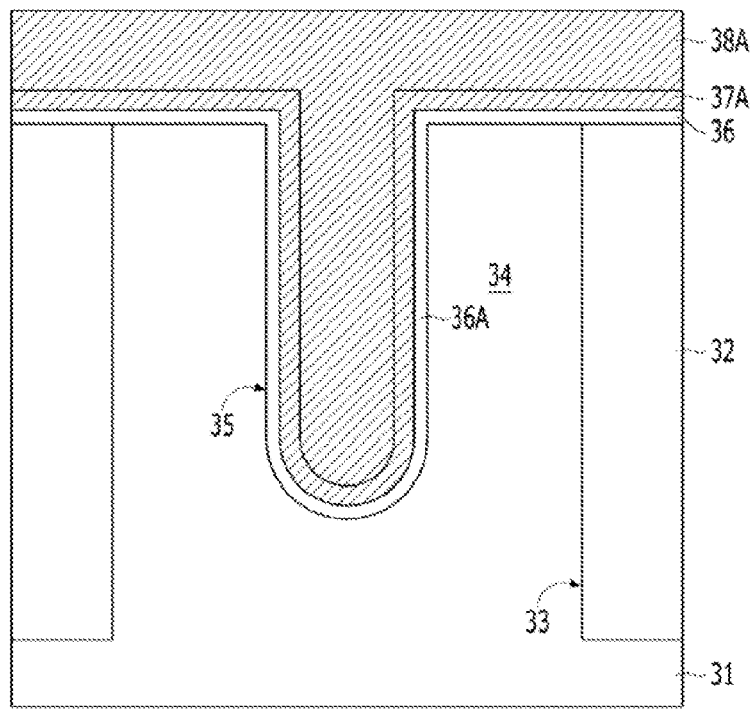
FIGS. 9A to 9F are cross-sectional views describing a method for fabricating the semiconductor device in accordance with the second embodiment.

As shown in FIG. 9A, an isolation layer 32 is formed in a substrate 31. An active region 34 is defined by the isolation layer 32.

A gate trench 35 is formed in the substrate 31. The gate trench 35 may be formed in a line shape across the active region 34 and the isolation layer 32. The gate trench 35 may be formed to be shallower than an isolation trench 33.

A gate dielectric layer 36A may be formed on the surface of the gate trench 35 and the top surfaces of the active region 34 and the isolation layer 32. The gate dielectric layer 36A may include a high-k material, oxide, nitride, oxynitride or a combination thereof.

A first work function liner layer 37A may be formed on the gate dielectric layer 36A. The first work function liner layer 37A may be conformally formed on the surface of the gate dielectric layer 36A. The first work function liner layer 37A may include a high work function material. The first work function liner layer 37A may include titanium aluminum nitride (TiAlN).

Next, a low resistivity layer 38A may be formed on the first work function liner layer 37A. The low resistivity layer 38A may fill the gate trench 35. The low resistivity layer 38A includes a low resistivity metal material. To prevent attack to the gate dielectric layer 36A, the low resistivity layer 38A may be formed of a material which does not contain an impurity such as fluorine. Furthermore, the low resistivity layer 38A may be formed of a non-reactive material to a second work function liner layer to be subsequently formed. The low resistivity layer 38A may be formed of titanium nitride. The low resistivity layer 38A may be formed by a chemical vapor deposition (CVD) process or an atomic layer deposition (ALD) process. In another embodiment, in the case where the low resistivity layer 38A is formed of tungsten, since tungsten is deposited by using a source gas such as tungsten hexafluoride ($WF_6$), the gate dielectric layer 36A may be attacked by fluorine. To prevent such an attack to the gate dielectric layer 36A, a barrier layer may be formed in advance before forming the low resistivity layer 38A. The barrier layer may include titanium nitride.

Figure 9B:
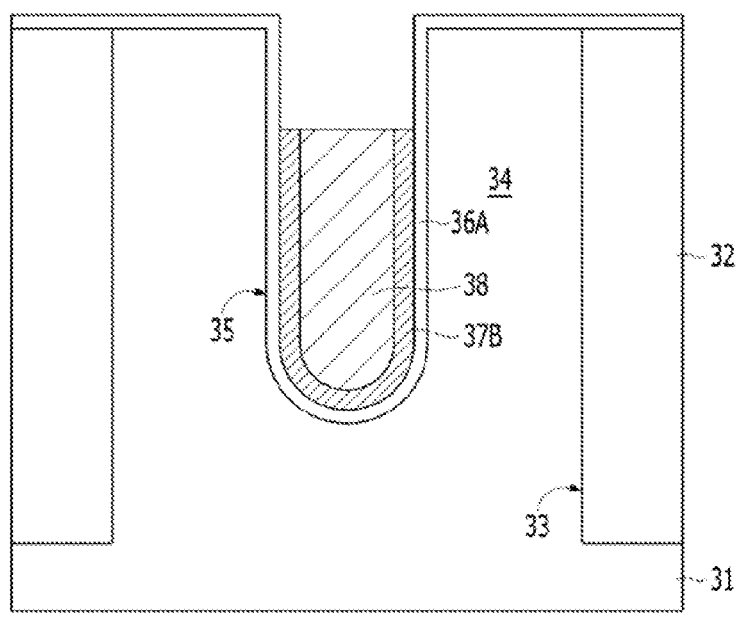

As shown in FIG. 9B, a first recessing process is performed in such a manner that a preliminary first work function liner 37B and a single low resistivity electrode 38 remain in the gate trench 35. The first recessing process may be performed by a dry etch process, for example, an etch-back process. The preliminary first work function liner 37B is formed by the etch-back process on the first work function liner layer 37A. The single low resistivity electrode 38 is formed by the etch-back process on the low resistivity layer 38A. The first recessing process may be performed in such a manner that, after a planarization process is performed, an etch-back process is subsequently performed.

The preliminary first work function liner 37B and the single low resistivity electrode 38 are recessed to be lower than the top surface of the active region 34. The first recessing process of the second embodiment has a depth different from the first recessing process of the first embodiment. That is, the first recessing process of the second embodiment may be performed shallower than the first recessing process of the first embodiment.

Figure 9C:
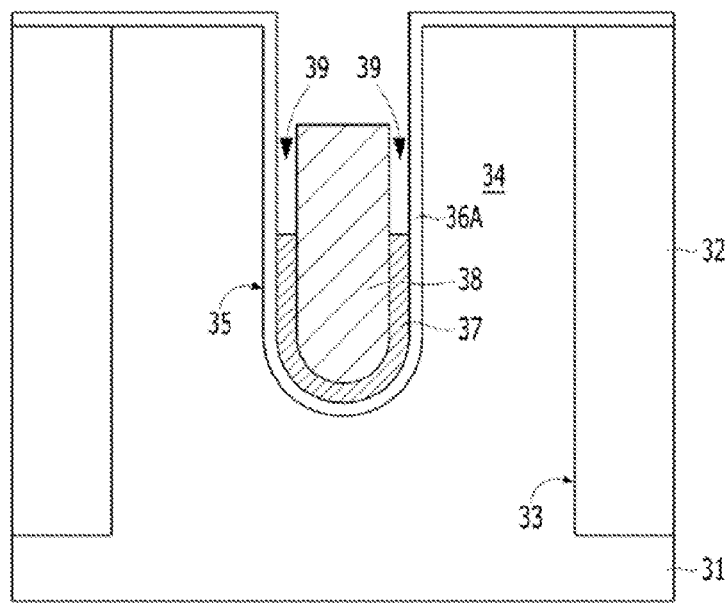

As shown in FIG. 9C, a second recessing process may be performed. By the second recessing process, a first work function liner 37 and gaps 39 may be formed. The second recessing process may selectively recess the preliminary first work function liner 37B. For example, the second recessing process has a high selectivity to the single low resistivity electrode 38, and selectively etches only the preliminary first work function liner 37B.

By the second recessing process, the first work function liner 37, which is recessed to be lower than the top surface of the single low resistivity electrode 38, is formed. The recessed spaces of the first work function liner 37 remain as the gaps 39.

Figure 9D:
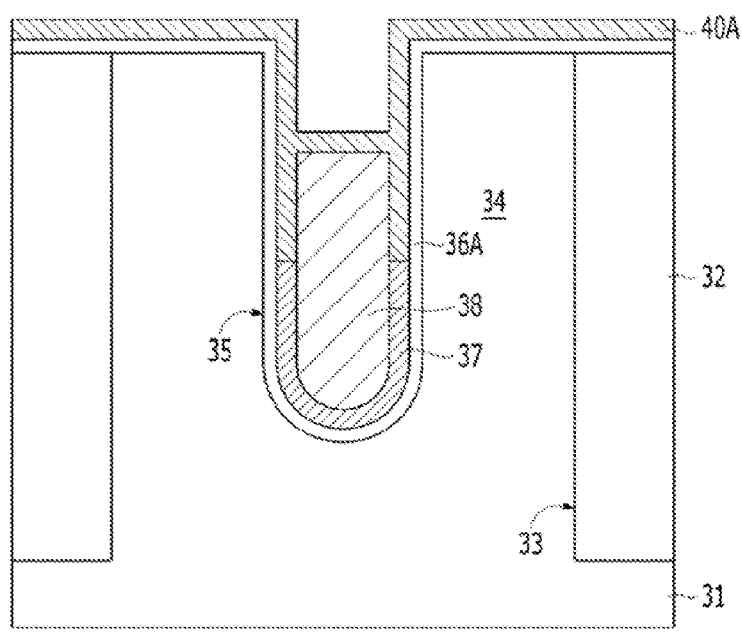

As shown in FIG. 9D, a second work function liner layer 40A may be formed on a resultant structure including the gaps 39. The second work function liner layer 40A may fill the gaps 39. The second work function liner layer 40A may be a work function material different from the first work function liner 37. The second work function liner layer 40A includes a low work function material. The second work function liner layer 40A may be formed of a non-metal material. The second work function liner layer 40A may include polysilicon doped with an N-type impurity.

Figure 9E:
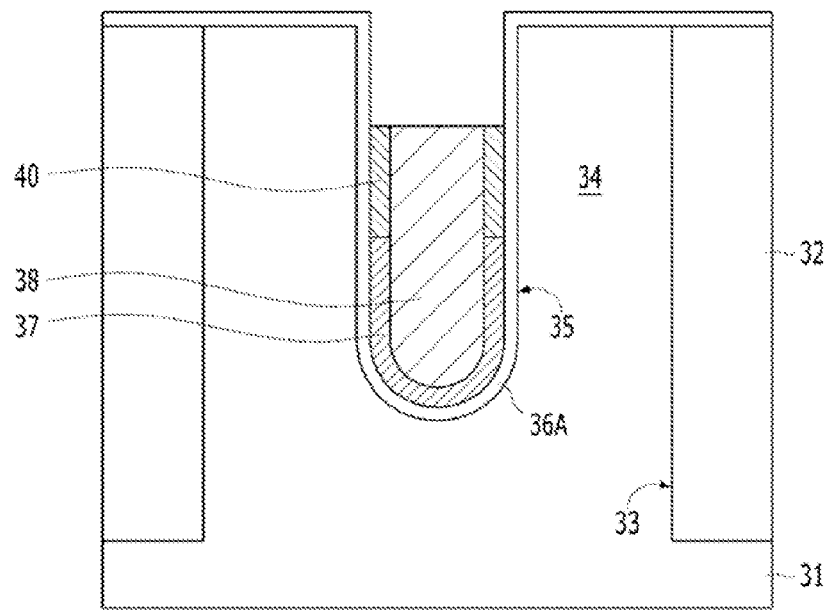

As shown in FIG. 9E, the second work function liner layer 40A may be etched. For example, the second work function liner layer 40A may be etched back. Accordingly, a second work function liner 40 may be formed. The second work function liner 40 may have a shape of spacers. The top surfaces of the second work function liner 40 and the single low resistivity electrode 38 may be positioned at the same level.

Figure 9F:
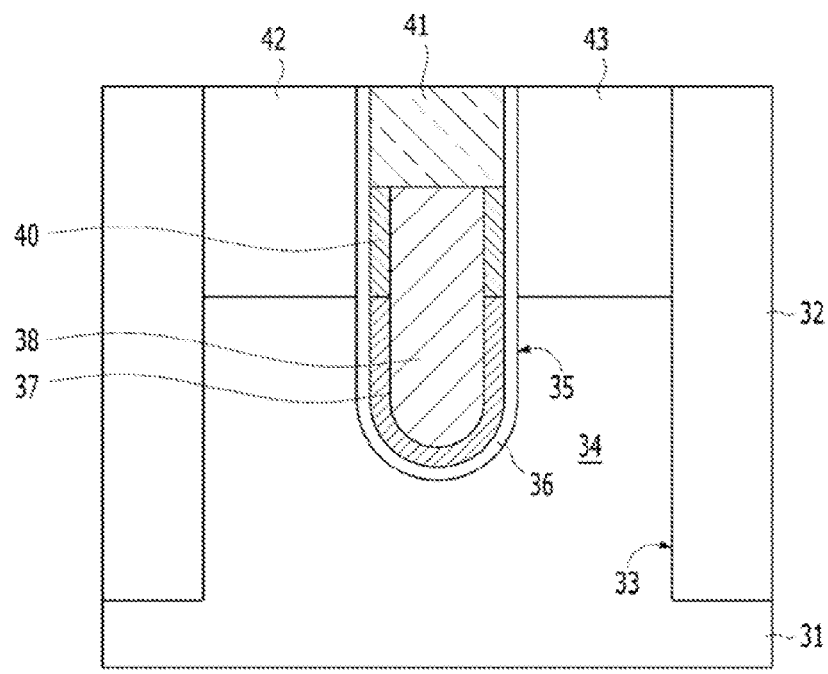

As shown in FIG. 9F, a capping layer 41 may be formed to fill an upper part of the gate trench 35. The capping layer 41 is formed on the single low resistivity electrode 38 and the second work function liner 40. The capping layer 41 includes a dielectric material. The capping layer 41 may include silicon nitride. As a method of forming the capping layer 41, after a preliminary capping layer (not shown) is formed on a resultant structure including the single low resistivity electrode 38 and the second work function liner 40, a planarization process on the preliminary capping layer may be performed until the top surface of the active region 34 is exposed. When or after performing the planarization process on the preliminary capping layer, the gate dielectric layer 36A on the top surface of the active region 34 may be removed to form a gate dielectric layer 36.

After forming the capping layer 41, an impurity doping process is performed by implantation or another doping technology. As a result, a first impurity region 42 and a second impurity region 43 are formed in the substrate 31. The first impurity region 42 and the second impurity region 43 respectively become a source region and a drain region. The gate dielectric layer 36A on the top surface of the active region 34 may be removed after the impurity doping process.

The first impurity region 42 and the second impurity region 43 may overlap with the second work function liner 40.

In another embodiment, the first impurity region 42 and the second impurity region 43 may be formed before forming the gate trench 35. For example, after forming an impurity region by doping an impurity into the active region 34 through using an ion implantation mask, the gate trench 35 may be formed. The impurity region may be divided into the first impurity region 42 and the second impurity region 43 by the gate trench 35.

FIGS. 10A to 10I are cross-sectional views describing a method for fabricating the semiconductor device shown in FIG. 8D. A method for fabricating the remaining components except a gate electrode, will be referred to in FIGS. 9A to 9F.

Figure 10A:
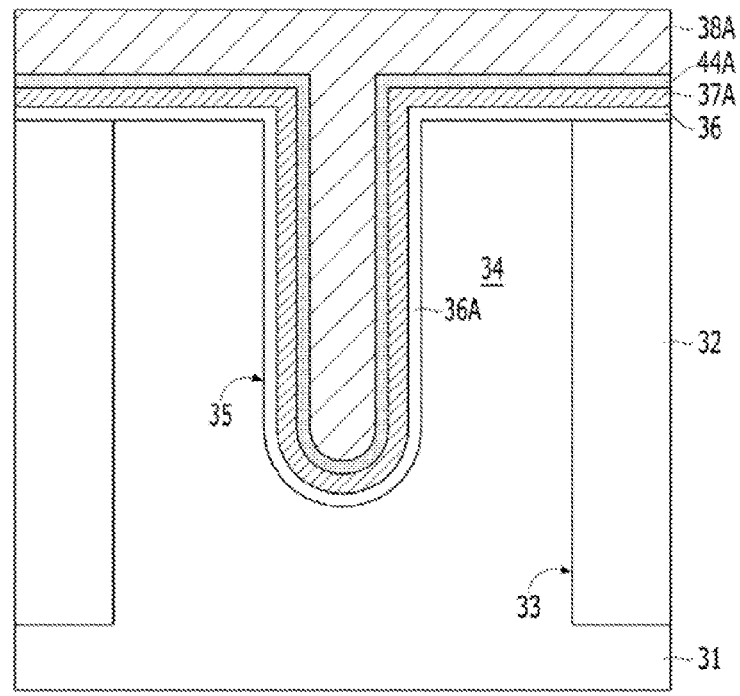
FIGS. 10A to 10I are cross-sectional views describing a method for fabricating the semiconductor device shown in FIG. 8D.

As shown in FIG. 10A, an isolation layer 32 is formed in a substrate 31. An active region 34 is defined by the isolation layer 32. A gate trench 35 is formed in the substrate 31. A gate dielectric layer 36A may be formed on the surface of the gate trench 35 and the top surfaces of the active region 34 and the isolation layer 32.

A first work function liner layer 37A may be formed on the gate dielectric layer 36A. The first work function liner layer 37A may be conformally formed on the surface of the gate dielectric layer 36A. The first work function liner layer 37A may include a high work function material. The first work function liner layer 37A may include titanium aluminum nitride (TiAlN).

A first barrier layer 44A and a low resistivity layer 38A may be sequentially formed on the first work function liner layer 37A. The first barrier layer 44A may be conformally formed on the surface of the first work function liner layer 37A. The low resistivity layer 38A may fill the gate trench 35. The low resistivity layer 38A includes a low resistivity metal material. The low resistivity layer 38A may be formed of a material which contains an impurity such as fluorine. Further, the low resistivity layer 38A may be formed of a reactive material to a second work function liner layer to be subsequently formed. The low resistivity layer 38A may be formed of tungsten. The low resistivity layer 38A may be formed by a chemical vapor deposition (CVD) process or an atomic layer deposition (ALD) process. The first barrier layer 44A may include titanium nitride.

Figure 10B:
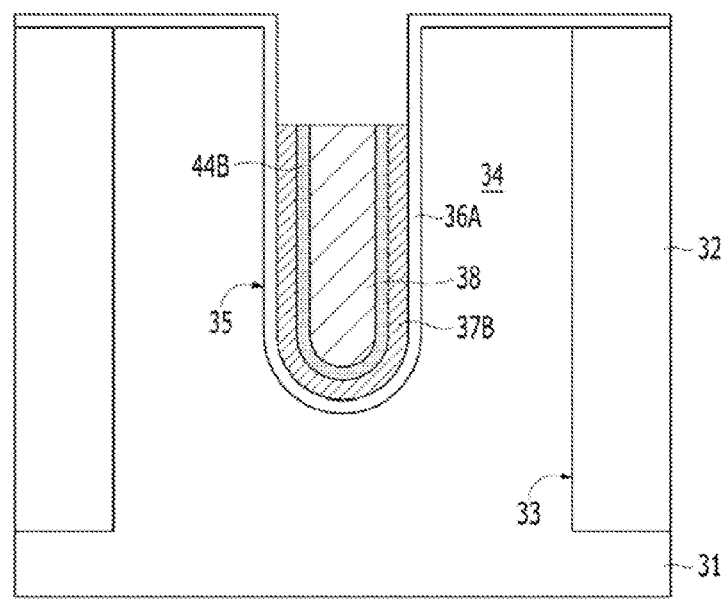

As shown in FIG. 10B, a first recessing process is performed in such a manner that a preliminary first work function liner 37B, a preliminary first barrier 44B and a preliminary single low resistivity electrode 38 remain in the gate trench 35. The first recessing process may be performed by a dry etch process, for example, an etch-back process. The preliminary first work function liner 37B is formed by the etch-back process on the first work function liner layer 37A. The preliminary first barrier 44B is formed by the etch-back process on the first barrier layer 44A. The preliminary single low resistivity electrode 38 is formed by the etch-back process on the low resistivity layer 38A. The first recessing process may be performed in such a manner that, after a planarization process is performed, an etch-back process is subsequently performed.

The preliminary first work function liner 376, the preliminary first barrier 446, and the preliminary single low resistivity electrode 38 are recessed to be lower than the top surface of the active region 34. The top surfaces of the preliminary first work function liner 37B, the preliminary first barrier 44B, and the preliminary single low resistivity electrode 38 may be positioned at the same level.

Figure 10C:
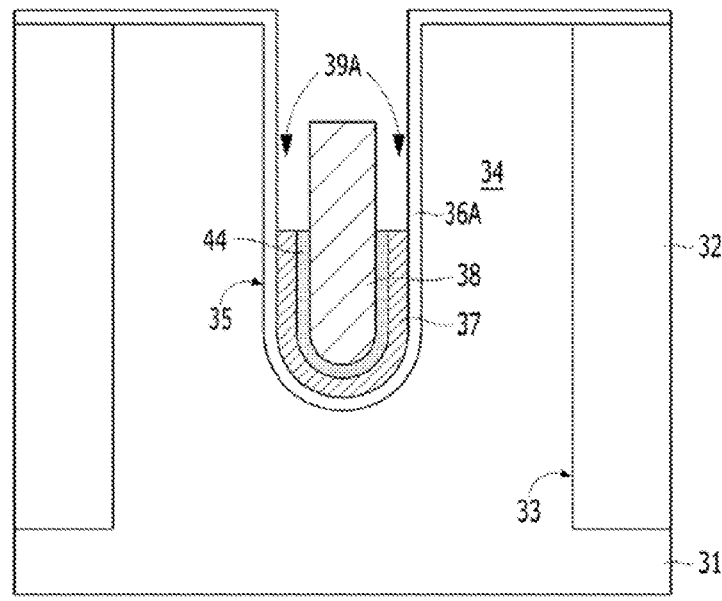

As shown in FIG. 10C, a second recessing process may be performed. By the second recessing process, a first work function liner 37, a first barrier 44, and preliminary gaps 39A may be formed. The second recessing process may selectively recess the preliminary first work function liner 376 and the preliminary first barrier 44B. For example, the second recessing process has a high selectivity to the preliminary single low resistivity electrode 38, and selectively etches only the preliminary first work function liner 37B and the preliminary first barrier 44B.

By the second recessing process, the first work function liner 37 and the first barrier 44, which are recessed to be lower than the top surface of the preliminary single low resistivity electrode 38, are formed. The recessed spaces of the first work function liner 37 and the first barrier 44 remain as the preliminary gaps 39A.

Figure 10D:
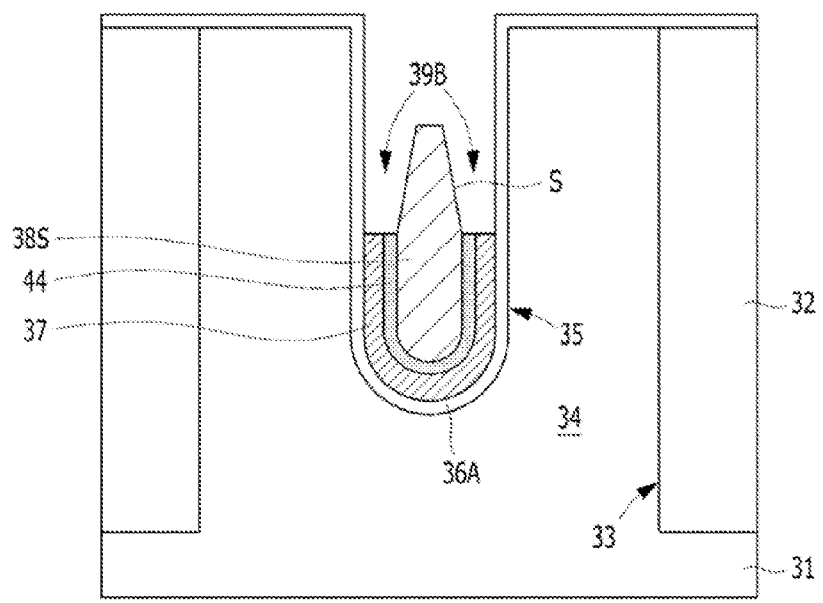

As shown in FIG. 10D, the preliminary single low resistivity electrode 38 is additionally recessed. Accordingly, a single low resistivity electrode 38S is formed. The upper sidewalls of the single low resistivity electrode 38S may have a sloped profile S. Moreover, widened gaps 39B may be formed.

Figure 10E:
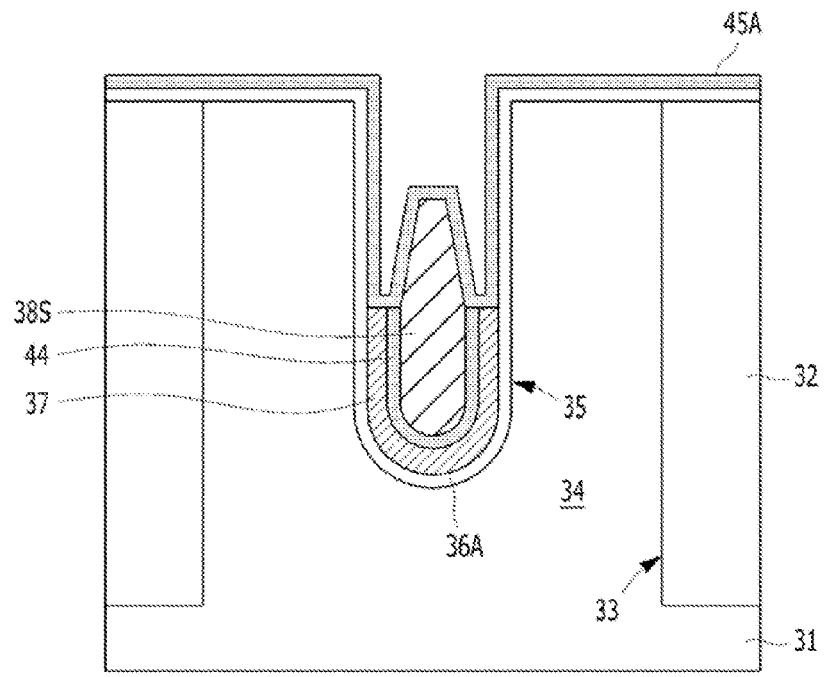

As shown in FIG. 10E, a second barrier layer 45A is formed. The second barrier layer 45A may be conformally formed. The gaps 39B are not filled with the second barrier layer 45A. The second barrier layer 45A may include titanium nitride.

Figure 10F:
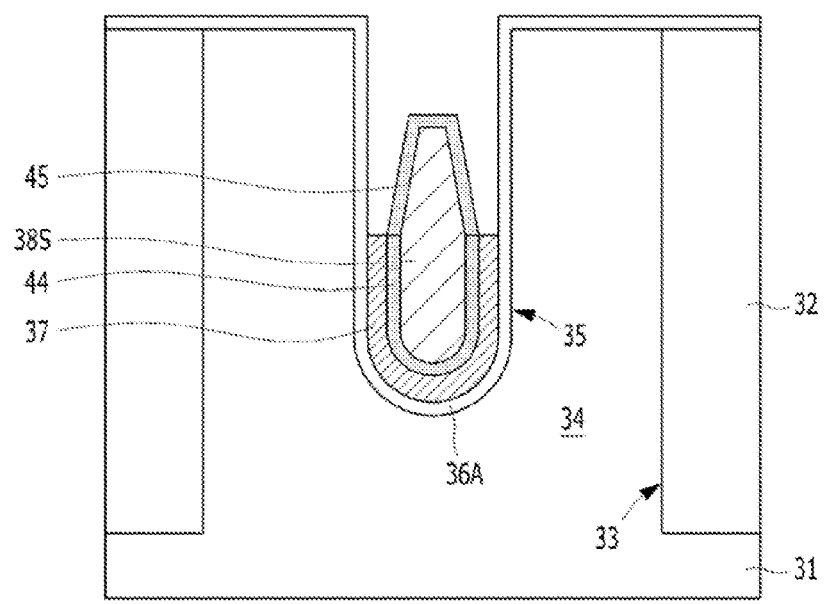

As shown in FIG. 10F, a second barrier 45 may be formed. The second barrier 45 may be formed by an etch-back process on the second barrier layer 45A. The second barrier 45 may be formed on the upper sidewalls and the top surface of the single low resistivity electrode 38S. The second barrier 45 may contact the first barrier 44. In another embodiment, the second barrier 45 may be formed on only the upper sidewalls of the single low resistivity electrode 38S.

Figure 10G:
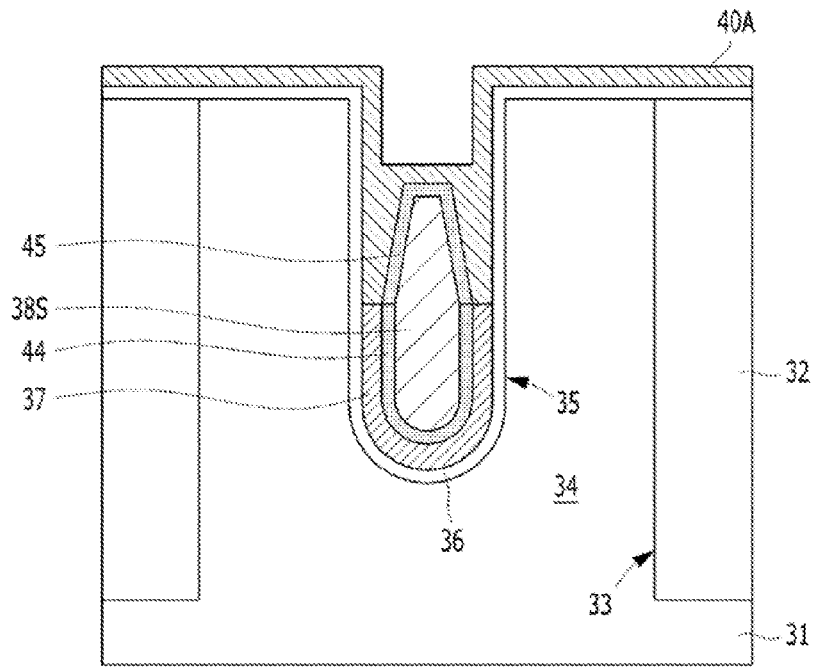

As shown in FIG. 10G, a second work function liner layer 40A may be formed over a resultant structure including the gaps 39B. The second work function liner layer 40A may fill the gaps 39B. The second work function liner layer 40A may be a work function material different from the first work function liner 37. The second work function liner layer 40A includes a low work function material. The second work function liner layer 40A may be formed of a non-metal material. The second work function liner layer 40A may include polysilicon doped with an N-type impurity.

Figure 10H:
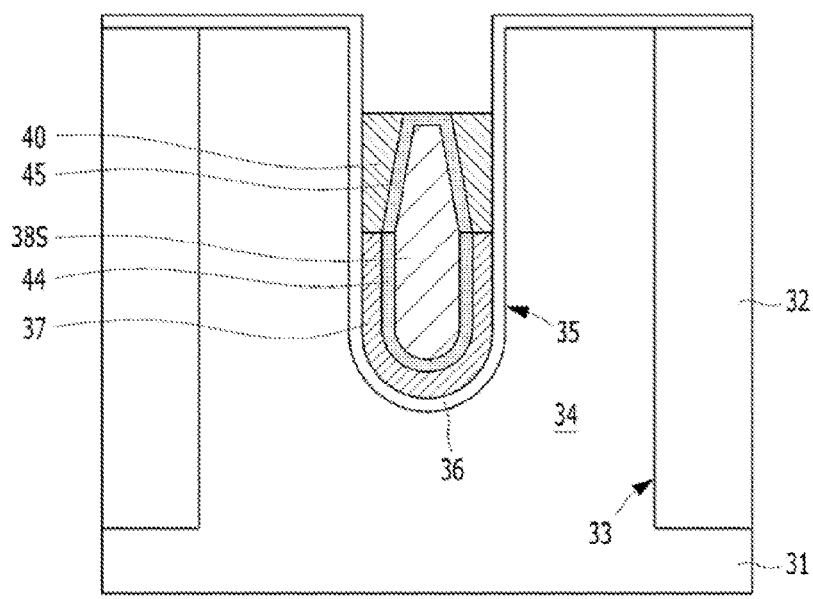

As shown in FIG. 10H, the second work function liner layer 40A may be etched. For example, the second work function liner layer 40A may be etched back. Accordingly, a second work function liner 40 may be formed. The second work function liner 40 may have a shape of spacers which fill the gaps 39B. The top surface of the second work function liner 40 may be positioned at a level higher than the single low resistivity electrode 38S. In another embodiment, the top surfaces of the second work function liner 40 and the single low resistivity electrode 38S may be positioned at the same level.

Figure 10I:
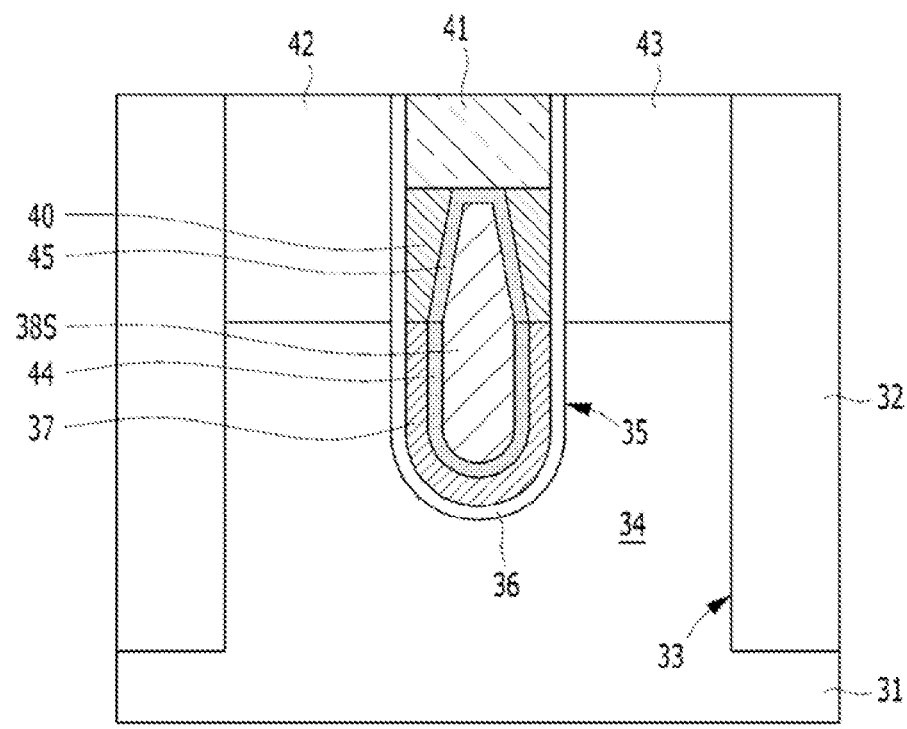

As shown in FIG. 10I, a capping layer 41 may be formed to fill an upper part of the gate trench 35. The capping layer 41 is formed over the second barrier 45 and the second work function liner 40. The capping layer 41 includes a dielectric material. The capping layer 41 may include silicon nitride. As a method for forming the capping layer 41, after a preliminary capping layer (not shown) is formed on a resultant structure including the second barrier 45 and the second work function liner 40, a planarization process on the preliminary capping layer may be performed until the top surface of the active region 34 is exposed. When or after performing the planarization process on the preliminary capping layer, the gate dielectric layer 36A on the top surface of the active region 34 may be removed to form a gate dielectric layer 36.

After forming the capping layer 41, an impurity doping process is performed by implantation or another doping technology. As a result, a first impurity region 42 and a second impurity region 43 are formed in the substrate 31. The first impurity region 42 and the second impurity region 43 respectively become a source region and a drain region. The gate dielectric layer 36A on the top surface of the active region 34 may be removed after the impurity doping process.

The first impurity region 42 and the second impurity region 43 may overlap with the second work function liner 40.

In another embodiment, the first impurity region 42 and the second impurity region 43 may be formed before forming the gate trench 35. For example, after forming an impurity region by doping an impurity into the active region 34 through using an ion implantation mask, the gate trench 35 may be formed. The impurity region may be divided into the first impurity region 42 and the second impurity region 43 by the gate trench 35.

Figure 11:
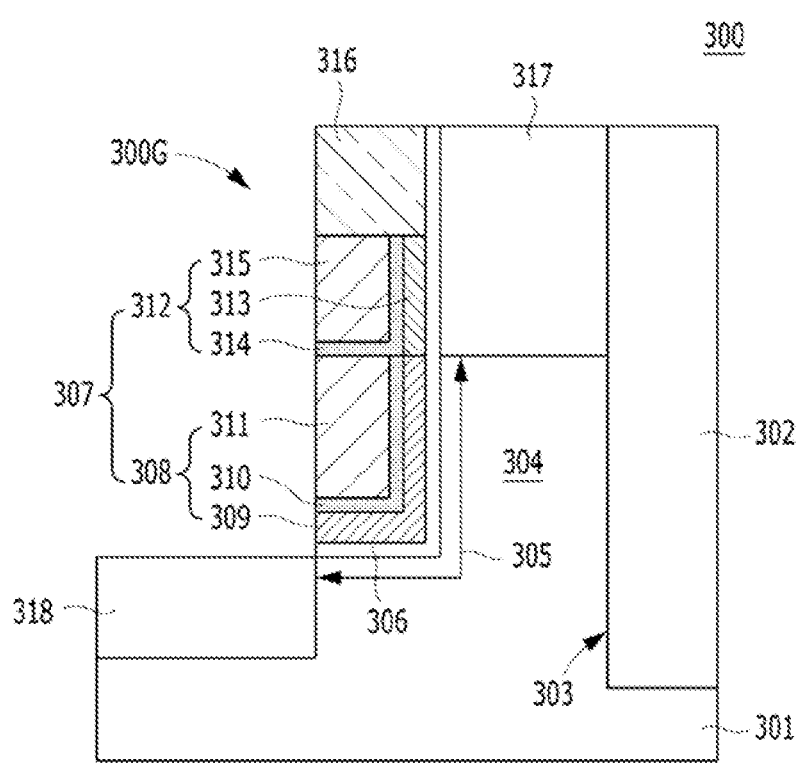
FIG. 11 is a cross-sectional view illustrating a semiconductor device in accordance with a third embodiment.

FIG. 11 is a cross-sectional view illustrating a semiconductor device in accordance with a third embodiment.

Referring to FIG. 11, a semiconductor device 300 in accordance with the third embodiment may include a pillar type active region 304 and a gate structure 300G. The semiconductor device 300 is illustrated as a vertical channel transistor being a non-planar type transistor.

An isolation layer 302 may be formed in a substrate 301. The isolation layer 302 may fill an isolation trench 303. The pillar type active region 304 may be vertically formed in the substrate 301. The pillar type active region 304 may include a first impurity region 317. A second impurity region 318 may be positioned in the substrate 301. A channel region 305 may be vertically disposed between the first impurity region 317 and the second impurity region 318.

The gate structure 300G may include a gate dielectric layer 306, a gate electrode 307, and a capping layer 316. The gate electrode 307 may be positioned at a level lower than the top surface of the pillar type active region 304. The gate electrode 307 may overlap with the sidewall of the pillar type active region 304. Accordingly, a vertical channel may be formed in the channel region 305 by the gate electrode 307. The gate electrode 307 may be referred to as a vertical gate electrode. The capping layer 316 may be disposed on the gate electrode 307. The gate dielectric layer 306 may be formed on the sidewall of the pillar type active region 304, and a portion of the surface of the substrate 301.

The gate electrode 307 may include a first vertical portion 308 and a second vertical portion 312. The first vertical portion 308 may include a first work function liner 309, a first barrier 310, and a first low resistivity electrode 311. The second vertical portion 312 may include a second work function liner 313, a second barrier 314, and a second low resistivity electrode 315.

The first work function liner 309 may be disposed between the first low resistivity electrode 311 and the channel region 305. The first work function liner 309 may overlap with the channel region 305.

The second work function liner 313 may be disposed between the first impurity region 317 and the second low resistivity electrode 315. The second work function liner 313 may overlap with the first impurity region 317.

The capping layer 316 may be formed on the second vertical portion 312.

The second impurity region 318 does not overlap with the gate electrode 307.

The first work function liner 309 and the second work function liner 313 may be conductive materials. The first work function liner 309 and the second work function liner 313 are formed of different work function materials. The first work function liner 309 may have a work function greater than the second work function liner 313. The first work function liner 309 may include a high work function material. The second work function liner 313 may include a low work function material. The high work function material is a material which has a work function greater than the mid-gap work function of silicon. The low work function material is a material which has a work function lower than the mid-gap work function of silicon. That is, the high work function material may have a work function greater than 4.5 eV, and the low work function material may have a work function lower than 4.5 eV. The first work function liner 309 may include a metal-containing material. The second work function liner 313 may include a non-metal material.

The first work function liner 309 may include a metal nitride, and the second work function liner 313 may include a silicon-containing material. The first work function liner 309 may include titanium aluminum nitride (TiAlN). The second work function liner 313 may include an N-type doped polysilicon.

The first low resistivity electrode 311 may be formed of a material which has a low resistivity and includes an impurity attacking the gate dielectric layer 306. Therefore, the first barrier 310 is disposed between the first low resistivity electrode 311 and the first work function liner 309. The first low resistivity electrode 311 may include tungsten. The first low resistivity electrode 311 may be a reactive material to the second work function liner 313.

The second low resistivity electrode 315 may be formed of a material which has a low resistivity and is reactive with the second work function liner 313. Therefore, the second barrier 314 is disposed between the second low resistivity electrode 315 and the second work function liner 313.

According to the third embodiment, since the second work function liner 313 has a low work function, gate-induced drain leakage (GIDL) in the first impurity region 317 may be suppressed. Since the channel dose of the channel region 305 is decreased by the first work function liner 309, junction leakage may be improved.

The semiconductor device 300 in accordance with the third embodiment may be modified in a variety of ways. For example, the gate structure may be modified similarly to the first embodiment and the modifications thereof, and the second embodiment and the modifications thereof.

The semiconductor device according to the embodiments may be integrated in a transistor circuit. Also, the semiconductor device according to the embodiments may be applied to an integrated circuit which includes transistors for various purposes. For example, the semiconductor device according to the embodiments may be applied to an integrated circuit including an insulated gate FET (IGFET), a high electron mobility transistor (HEMT), a power transistor, a thin film transistor (TFT), and so forth.

The semiconductor device, transistor and integrated circuit according to the embodiments may be embedded in an electronic device. The electronic device may include a memory and a non-memory. The memory includes an SRAM, a DRAM, a FLASH, an MRAM, a ReRAM, an STTRAM and an FeRAM. The non-memory includes a logic circuit. The logic circuit may include a sense amplifier, a decoder, an input/output circuit, etc. for controlling a memory device. Also, the logic circuit may include various integrated circuits (ICs) in addition to a memory. For example, the logic circuit includes a microprocessor, an application processor of a mobile device, etc. Moreover, the non-memory includes a logic gate such as a NAND gate, a driver IC for a display device, a power semiconductor device such as a power management IC (PMIC), etc. The electronic device may include a computing system, an image sensor, a camera, a mobile device, a display device, a sensor, a medical instrument, an optoelectronic device, a radio frequency identification (RFID), a solar cell, a semiconductor device for a vehicle, a semiconductor device for a railroad car, a semiconductor device for an aircraft, etc.

Figure 12:
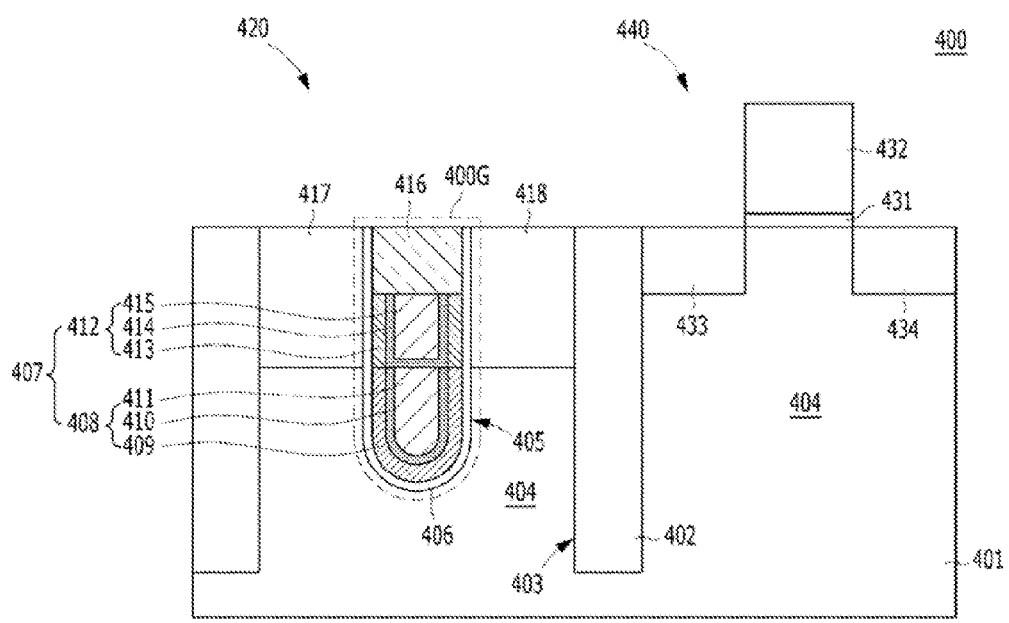
FIG. 12 is a cross-sectional view illustrating a transistor circuit including the semiconductor device in accordance with the embodiments.

FIG. 12 is a cross-sectional view illustrating a transistor circuit including the semiconductor device in accordance with the embodiments.

Referring to FIG. 12, a transistor circuit 400 includes a first transistor 420 and a second transistor 440. The first transistor 420 and the second transistor 440 are formed in a substrate 401, and are isolated from each other by an isolation layer 402.

The first transistor 420 includes a gate structure 400G, a first source region 417, and a first drain region 418. The gate structure 400G is formed in a gate trench 405. The gate trench 405 has a type across the isolation layer 402 and an active region 404. The isolation layer 402 may be formed by filling a dielectric material in the isolation trench 403.

The gate structure 400G may include a first gate dielectric layer 406, a buried gate electrode 407, and a capping layer 416. The buried gate electrode 407 includes a lower buried portion 408 and an upper buried portion 412. The lower buried portion 408 includes a first work function liner 409, a lower barrier 410, and a first low resistivity electrode 411. The upper buried portion 412 includes a second work function liner 413, an upper barrier 414, and a second low resistivity electrode 415. The first work function liner 409 may include titanium aluminum nitride (TiAlN), and the second work function liner 413 may include an N-type doped polysilicon.

The second transistor 440 includes a planar gate electrode 432, a second source region 433, and a second drain region 434. A second gate dielectric layer 431 is formed under the planar gate electrode 432. The planar gate electrode 432 may include a polysilicon, a metal, a metal nitride, a metal compound or a combination thereof. The second gate dielectric layer 431 may include at least one selected from silicon oxide, silicon nitride, silicon oxynitride and a high-k material. The high-k material may include a hafnium-based material. In the second gate dielectric layer 431, an interfacial layer and a high-k material may be stacked. The Interfacial layer may include silicon oxide, silicon nitride or silicon oxynitride.

As may be seen from the above descriptions, in the transistor circuit 400, the first transistor 420 having the buried gate electrode 407 and the second transistor 440 having the planar gate electrode 432 are integrated in one substrate 401. After forming the first transistor 420, the second transistor 440 may be formed.

In the transistor circuit 400, both the first transistor 420 and the second transistor 440 may be NMOSFETs. Also, both the first transistor 420 and the second transistor 440 may be PMOSFETs.

The transistor circuit 400 may be a CMOSFET. For example, any one transistor of the first transistor 420 and the second transistor 440 may be an NMOSFET, and the other transistor may be a PMOSFET. In the planar gate electrode 432 of the second transistor 440, an appropriate work function material may be selected to adjust a threshold voltage. For example, in the case of a PMOSFET, for the planar gate electrode 432, a P-type work function material may be selected to have a work function appropriate for the PMOSFET.

The first transistor 420 may be referred to as a buried gate type transistor, and the second transistor 440 may be referred to as a planar gate type transistor.

In the transistor circuit 400, the first transistor 420 may be the transistor of a memory cell, and the second transistor 440 may be the transistor of a peripheral circuit.

In this way, since the buried gate electrode 407 is formed to include the first work function liner 409 of a high work function and the second work function liner 413 of a low work function, the performance of the transistor circuit 400 may be improved.

Figure 13:
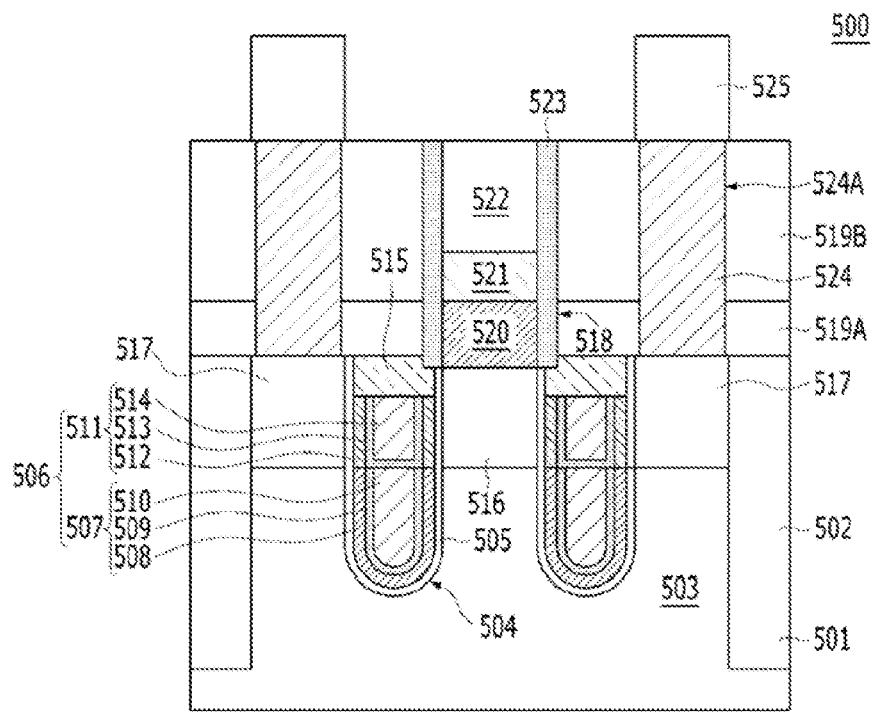
FIG. 13 is a cross-sectional view illustrating a memory cell including the semiconductor device in accordance with the embodiments.

FIG. 13 is a cross-sectional view illustrating a memory cell including the semiconductor device in accordance with the embodiments.

Referring to FIG. 13, a memory cell 500 includes a buried word line 506, a bit line 521, and a memory element 525.

The memory cell 500 will be described below in detail.

An isolation layer 502 is formed in a substrate 501. A plurality of active regions 503 are defined by the isolation layer 502. A gate trench 504 is formed across the active region 503. A gate dielectric layer 505 is formed on the surface of the gate trench 504.

The buried word line 506 is formed on the gate dielectric layer 505 to fill a lower part of the gate trench 504. The buried word line 506 includes a lower buried portion 507 and an upper buried portion 511. The lower buried portion 507 includes a high work function liner 508, a lower barrier 509, and a first low resistivity electrode 510. The upper buried portion 511 includes a low work function liner 512, an upper barrier 513, and a second low resistivity electrode 514. The high work function liner 508 may include titanium aluminum nitride (TiAlN). The low work function liner 512 may include an N-type doped polysilicon. The lower barrier 509 and the upper barrier 513 may include titanium nitride. The first low resistivity electrode 510 and the second low resistivity electrode 514 may include tungsten. The buried word line 506 has the same construction as the gate electrode 107 according to the fourth modification of the first embodiment shown in FIG. 4D. In other embodiments, the buried word line 506 may have the same construction as the first embodiment and the modifications thereof, and the second embodiment and the modifications thereof.

A capping layer 515 is formed on the buried word line 506 to fill an upper part of the gate trench 504. A first impurity region 516 and a second impurity region 517 are formed in the substrate 501 on both sides of the buried word line 506. The buried word line 506, the first impurity region 516 and the second impurity region 517 may construct a cell transistor.

A bit line structure which is electrically coupled to the first impurity region 516 may be formed. The bit line structure includes the bit line 521 and a bit line hard mask layer 522. The bit line structure may further include a first contact plug 520 between the bit line 521 and the first impurity region 516. Spacers 523 are formed on the sidewalls of the bit line structure. First and second interlayer dielectric layers 519A and 519B are formed on the substrate 501. The first contact plug 520 may be formed in a first contact hole 518. The first contact hole 518 may be formed in the first interlayer dielectric layer 519A. The first contact plug 520 is electrically coupled to the first impurity region 516. The line widths of the first contact plug 520 and the bit line 521 may be the same. Accordingly, gaps are present between the first contact plug 520 and the sidewalls of the first contact hole 518, and portions of the spacers 523 extend to fill the gaps. The top surface of the first impurity region 516 may be recessed, and thus, the contact area between the first contact plug 520 and the first impurity region 516 increases. The bit line 521 may have a line shape which extends in a direction crossing with a direction in which the buried word line 506 extends. The bit line 521 may include at least one selected from polysilicon, a metal silicide, a metal nitride and a metal. The bit line hard mask layer 522 may include silicon oxide or silicon nitride. The first contact plug 520 may include at least one selected from polysilicon, a metal silicide, a metal nitride and a metal.

The spacers 523 include a dielectric material. The spacers 523 may include silicon oxide, silicon nitride or a combination of silicon oxide and silicon nitride. The spacers 523 may have a multi-spacer structure. For example, the spacers 523 may be an NON structure of silicon nitride/silicon oxide/silicon nitride. The spacers 523 may be an air gap-embedded multi-spacer structure.

The memory element 525 may be formed over the second impurity region 517. A second contact plug 524 may be formed between the memory element 525 and the second impurity region 517. A second contact hole 524A may be formed to pass through the first and second interlayer dielectric layers 519A and 519B, and the second contact plug 524 may be formed in the second contact hole 524A. The second contact plug 524 may be electrically coupled to the second impurity region 517. The second contact plug 524 may include at least any one selected from polysilicon, a metal, a metal silicide and a metal nitride. For example, the second contact plug 524 may include a plug structure in which polysilicon, a metal silicide and a metal are stacked.

Each of the first and second interlayer dielectric layers 519A and 519B may be a single-layered structure or a multi-layered structure. Each of the first and second interlayer dielectric layers 519A and 519B may include at least any one selected from silicon oxide, silicon nitride and silicon oxynitride. The second interlayer dielectric layer 519B serves to isolate adjacent second contact plugs 524. In another embodiment, contact spacers (not shown) which surround the sidewalls of the second contact plug 524 may be additionally formed. The contact spacers may be an air gap-embedded multi-spacer structure.

In another embodiment, a third contact plug (not shown) may be additionally formed on the second contact plug 524. The third contact plug may have a type which overlaps with the bit line structure and the second contact plug 524. The third contact plug may include a metal material.

The memory element 525 may be formed on the second contact plug 524 to be electrically coupled to the second contact plug 524. The memory element 525 may be realized as a variety of types.

The memory element 525 may be a capacitor. Accordingly, the memory element 525 may include a storage node which contacts the second contact plug 524. The storage node may be a cylinder type or a pillar type. A capacitor dielectric layer may be formed on the surface of the storage node. The capacitor dielectric layer may include at least any one selected from zirconium oxide, aluminum oxide and hafnium oxide. For example, the capacitor dielectric layer may be a ZAZ structure in which first zirconium oxide, aluminum oxide and second zirconium oxide are stacked. A plate node is formed on the capacitor dielectric layer. The storage node and the plate node may include a metal-containing material.

In another embodiment, the memory element 525 may include a variable resistor. The variable resistor may include a phase change material. The phase change material may include at least one selected between tellurium (Te) and selenium (Se) as chalcogenide elements. In another embodiment, the variable resistor may include a transition metal oxide. In still another embodiment, the variable resistor may be a magnetic tunnel junction (MTJ).

As described above, the memory cell 500 may include the buried word line 506 which includes the high work function liner 508 and the low work function liner 512. In the case where the memory cell 500 is applied to a DRAM, the refresh characteristic of the DRAM may be improved.

Figure 14:
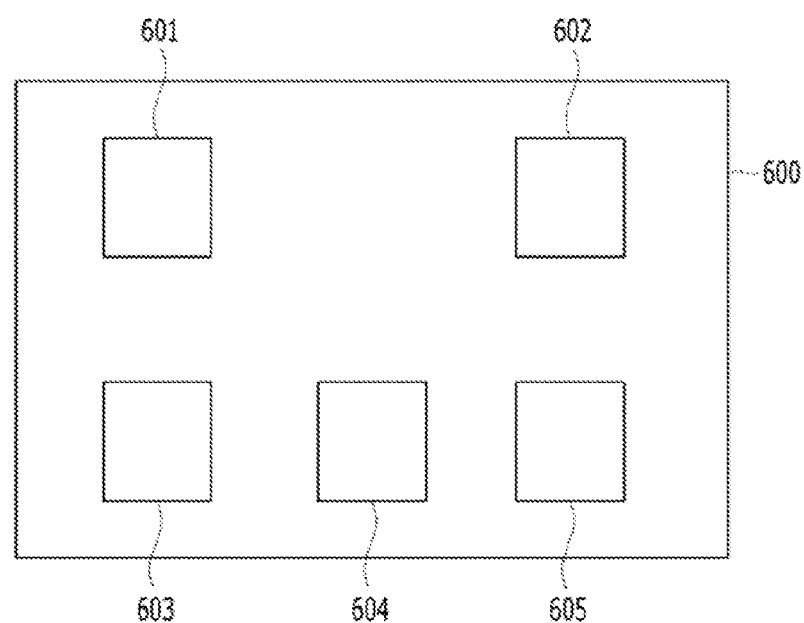
FIG. 14 is a diagram illustrating an electronic device including the semiconductor device in accordance with the embodiments.

FIG. 14 is a diagram illustrating an electronic device including the semiconductor device in accordance with the embodiments.

Referring to FIG. 14, an electronic device 600 may include a plurality of semiconductor devices 601, 602, 603, 604 and 605. For example, the electronic device 600 may include at least one among the semiconductor devices 100, 200 and 300, the transistor circuit 400 and the memory cell 500 according to the above-described embodiments and modifications thereof.

At least one semiconductor device among the semiconductor devices included in the electronic device 600 includes a buried gate electrode which is formed in a gate trench. The buried gate electrode may include a high work function liner and a low work function liner. The low work function liner overlaps with a source region and a drain region, and accordingly, improves gate-induced drain leakage (GIDL). Accordingly, the electronic device 600 may realize a high operation speed in correspondence to scale-down.

As is apparent from the above descriptions, according to the embodiments, since a low work function liner including an N-type doped polysilicon is formed between a gate electrode and a source region/a drain region, gate-induced drain leakage may be reduced.

Also, according to the embodiments, since a high work function liner including titanium aluminum nitride overlaps with a channel, channel dose may be decreased and junction leakage may be reduced.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a substrate in which a trench is formed;
a first impurity region and a second impurity region formed in the substrate separated from each other by the trench;
a gate electrode formed to fill a lower part of the trench; and
a capping layer formed over the gate electrode to fill an upper part of the trench,
wherein the gate electrode comprises:
a first work function liner formed over a bottom surface and lower sidewalls of the lower part of the trench, not overlapping with the first impurity region and the second impurity region, and formed of titanium aluminum nitride; and
a second work function liner formed over upper sidewalls of the lower part of the trench over the first work function liner, overlapping with the first impurity region and the second impurity region, and including a silicon-containing non-metal material.

2. The semiconductor device according to claim 1, wherein the first work function liner has a work function greater than the second work function liner.

3. The semiconductor device according to claim 1, wherein the first work function liner has a high work function greater than a mid-gap work function of silicon, and the second work function liner has a low work function lower than the mid-gap work function of silicon.

4. The semiconductor device according to claim 1, wherein the second work function liner includes an N-type impurity-doped polysilicon.

5. The semiconductor device according to claim 1, wherein the gate electrode further comprises:
a first low resistivity electrode partially filling the lower part of the trench over the first work function liner; and
a second low resistivity electrode formed over the first low resistivity electrode to fill the remaining lower part of the trench over the second work function liner.

6. The semiconductor device according to claim 5, wherein the second low resistivity electrode is a non-reactive material to the second work function liner.

7. The semiconductor device according to claim 5, wherein the first low resistivity electrode includes a fluorine-free material and is non-reactive with the second work function liner.

8. The semiconductor device according to claim 5, wherein the second low resistivity electrode includes a reactive material to the second work function liner, and the first low resistivity electrode includes a fluorine-free material and is non-reactive with the second work function liner.

9. The semiconductor device according to claim 5, further comprising:
a fin region formed below the trench in which the first low resistivity electrode is formed.

10. A semiconductor device comprising:
a substrate in which a trench is formed;
a first impurity region and a second impurity region formed in the substrate separated from each other by the trench;
a gate electrode formed to fill a lower part of the trench; and a capping layer formed over the gate electrode to fill an upper part of the trench, wherein the gate electrode comprises:

a first work function liner formed over a bottom surface and lower sidewalls of the lower part of the trench, not overlapping with the first impurity region and the second impurity region, and formed of titanium aluminum nitride;

a second work function liner formed over upper sidewalls of the lower part of the trench over the first work function liner, overlapping with the first impurity region and the second impurity region, and including a silicon-containing non-metal material;

a first low resistivity electrode partially filling the lower part of the trench over the first work function liner; and a second low resistivity electrode formed over the first low resistivity electrode to fill the remaining lower part of the trench over the second work function liner, wherein each of the first low resistivity electrode and the second low resistivity electrode includes a material which is reactive with the second work function liner.

11. The semiconductor device according to claim 10, wherein the gate electrode further comprises:

a lower barrier between the first work function liner and the first low resistivity electrode; and an upper barrier between the second work function liner and the second low resistivity electrode.

12. The semiconductor device according to claim 11, wherein the gate electrode further comprises:

an intermediate barrier between the first low resistivity electrode and the second work function liner.

13. The semiconductor device according to claim 10, wherein the first low resistivity electrode and the second low resistivity electrode include tungsten.

14. The semiconductor device according to claim 10, wherein the second work function liner includes N-type impurity-doped polysilicon.

15. The semiconductor device according to claim 10, further comprising:

a fin region formed below the trench in which the first low resistivity electrode is formed.

* * * * *